(12) United States Patent
Ahn et al.

(10) Patent No.: US 10,444,586 B2
(45) Date of Patent: Oct. 15, 2019

(54) LIQUID CRYSTAL DISPLAY DEVICE AND METHOD FOR FABRICATING THE SAME

(71) Applicant: Samsung Display Co., Ltd., Yongin-Si, Gyeonggi-Do (KR)

(72) Inventors: Taeyoung Ahn, Suwon-si (KR); Bogeon Jeon, Hwaseong-si (KR); Wooseok Jeon, Seoul (KR); Yungbin Chung, Yongin-si (KR); Eunjeong Cho, Busan (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 16/129,503

(22) Filed: Sep. 12, 2018

(65) Prior Publication Data

US 2019/0011745 A1    Jan. 10, 2019

Related U.S. Application Data

(62) Division of application No. 15/360,736, filed on Nov. 23, 2016, now Pat. No. 10,101,627.

(30) Foreign Application Priority Data

Jan. 20, 2016    (KR) .......................... 10-2016-0007047

(51) Int. Cl.
*H01L 27/12* (2006.01)
*G02F 1/1368* (2006.01)
(Continued)

(52) U.S. Cl.
CPC ........ *G02F 1/1368* (2013.01); *H01L 21/0273* (2013.01); *H01L 27/124* (2013.01);
(Continued)

(58) Field of Classification Search
CPC ............... H01L 27/1222; H01L 27/124; H01L 27/1288
See application file for complete search history.

(56) References Cited

U.S. PATENT DOCUMENTS

2011/0140116 A1    6/2011    Morosawa et al.
2011/0198606 A1    8/2011    Oda et al.
(Continued)

FOREIGN PATENT DOCUMENTS

KR    10-2013-0029040 A    3/2013
KR    10-2013-0124467 A    11/2013
(Continued)

OTHER PUBLICATIONS

Nobuyoshi Awaya, 'Selective Deposition of Silicon Oxide Using a Plasma-Fluorinated Resist Mask,' Japanese Journal of Applied Physics, vol. 27, No. 7, Jul. 1988, pp. 1172-1175.

*Primary Examiner* — Douglas M Menz
(74) *Attorney, Agent, or Firm* — Innovation Counsel LLP

(57) ABSTRACT

A liquid crystal display (LCD) device capable of perventing impurities from permeating into a channel area of a switching element, the LCD device including: a gate electrode above a substrate; a semiconductor layer which overlaps the gate electrode; a drain electrode and a source electrode which overlap the semiconductor layer; an ohmic contact layer between the semiconductor layer and the drain electrode and between the semiconductor layer and the source electrode; a pixel electrode which is connected to one of the drain electrode and the source electrode; and a gate insulating layer between the gate electrode and the semiconductor layer, the gate insulating layer comprising fluorine. A concentration of the fluorine is decreasing, as the fluorine of the gate insulating layer being more adjacent to the substrate.

11 Claims, 35 Drawing Sheets

(51) Int. Cl.

| | |
|---|---|
| *H01L 21/027* | (2006.01) |
| *H01L 29/49* | (2006.01) |
| *H01L 29/66* | (2006.01) |
| *H01L 29/786* | (2006.01) |
| *G02F 1/136* | (2006.01) |
| *G02F 1/1362* | (2006.01) |

(52) U.S. Cl.
CPC ...... *H01L 27/1222* (2013.01); *H01L 27/1288* (2013.01); *H01L 29/4908* (2013.01); *H01L 29/66765* (2013.01); *H01L 29/78618* (2013.01); *H01L 29/78669* (2013.01); *H01L 29/78678* (2013.01); *G02F 2001/13606* (2013.01); *G02F 2001/136218* (2013.01); *G02F 2001/136295* (2013.01); *G02F 2201/123* (2013.01)

(56) References Cited

U.S. PATENT DOCUMENTS

| | | |
|---|---|---|
| 2014/0225104 A1 | 8/2014 | Yamazaki et al. |
| 2015/0123098 A1 | 5/2015 | Kang |
| 2015/0129854 A1 | 5/2015 | Byun |
| 2015/0349099 A1 | 12/2015 | Yamazaki et al. |

FOREIGN PATENT DOCUMENTS

| | | |
|---|---|---|
| KR | 10-2014-0102151 A | 8/2014 |
| KR | 10-2015-0052645 A | 5/2015 |
| KR | 10-2015-0055919 A | 5/2015 |

LIQUID CRYSTAL DISPLAY DEVICE AND METHOD FOR FABRICATING THE SAME

CROSS-REFERENCE TO RELATED APPLICATION

This application is a divisional application of U.S. patent application Ser. No. 15/360,736 filed on Nov. 23, 2016, which claims priority under 35 U.S.C. § 119 of Korean Patent Application No. 10-2016-0007047, filed on Jan. 20, 2016, the entire contents of which are hereby incorporated by reference.

BACKGROUND

1. Field

Aspects of embodiments of the present inventive concept relate to a liquid crystal display (LCD) device capable of preventing impurities from diffusing into a channel area of a switching element and to a method of manufacturing the LCD device.

2. Description of the Related Art

An LCD device is a type of a flat panel display (FPD) which has become widely used in various applications recently. An LCD device includes two substrates respectively including two electrodes formed thereon and a liquid crystal layer interposed therebetween. Upon applying voltage to the two electrodes of the LCD device, liquid crystal molecules of the liquid crystal layer are rearranged such that an amount of transmitted light may be adjusted.

An LCD device includes a plurality of pixels, and each of the plurality of pixels includes a switching element, e.g., a thin film transistor (TFT), which applies a data voltage to a pixel electrode.

In a process of manufacturing a conventional switching element, impurities generated in an impurity semiconductor material diffused into a channel area of the switching element, thus causing an issue of increased leakage current in the switching element.

It is to be understood that this background of the technology section is intended to provide useful background for understanding the technology and as such disclosed herein, the technology background section may include ideas, concepts or recognitions that were not part of what was known or appreciated by those skilled in the pertinent art prior to a corresponding effective filing date of subject matter disclosed herein.

SUMMARY

Aspects of embodiments of the present inventive concept are directed to a liquid crystal display (LCD) display device capable of preventing impurities from permeating into a channel area of a switching element and to a method of manufacturing the LCD display device.

According to an embodiment of the present inventive concept, a liquid crystal display device includes: a gate electrode above a substrate; a semiconductor layer which overlaps the gate electrode; a drain electrode and a source electrode which overlap the semiconductor layer; an ohmic contact layer between the semiconductor layer and the drain electrode and between the semiconductor layer and the source electrode; a pixel electrode which is connected to one of the drain electrode and the source electrode; and a gate insulating layer between the gate electrode and the semiconductor layer, the gate insulating layer comprising fluorine A concentration of the fluorine is decreasing, as the fluorine of the gate insulating layer being more adjacent to the substrate.

The ohmic contact layer may have an impurity concentration of about $2*10^{21}$ atom/cm$^3$ or higher.

The fluorine is not included in the gate insulating layer corresponding to a center of a channel area which is disposed between the source electrode and the drain electrode.

The ohmic contact layer may contact the gate insulating layer.

The ohmic contact layer may include: a first ohmic contact layer between the drain electrode and the gate insulating layer, the first ohmic contact layer contacting the gate insulating layer; and a second ohmic contact layer between the source electrode and the gate insulating layer, the second ohmic contact layer contacting the gate insulating layer.

The first ohmic contact layer may be further disposed between the gate insulating layer and the data line which is connected to the drain electrode.

The semiconductor layer has substantially the same thickness as a thickness of a thickest portion of a non-channel area of the semiconductor layer.

A second surface of the semiconductor layer which is opposite to a first surface of the semiconductor layer is substantially flat, the first surface of the semiconductor layer facing the gate insulating layer.

According to an embodiment of the present inventive concept, a method of manufacturing a liquid crystal display device includes: forming a gate electrode above a substrate; forming a gate insulating layer above the gate electrode; forming a semiconductor material above the gate insulating layer; forming a first photoresist pattern and a second photoresist pattern above the semiconductor material, the second photoresist pattern having a smaller thickness than a thickness of the first photoresist pattern; patterning, using the first photoresist pattern and the second photoresist pattern as a mask, the semiconductor material to form a semiconductor layer which overlaps the gate electrode; removing a portion of the first photoresist pattern and the second photoresist pattern to form a third photoresist pattern which is disposed to correspond to a channel area of the semiconductor layer; hydrophobizating the third photoresist pattern; forming an impurity semiconductor material above the gate insulating layer and the semiconductor layer using the third photoresist pattern that is hydrophobizated as a mask; removing the third photoresist pattern; forming a conductive material above the impurity semiconductor material and the semiconductor layer; patterning, using a fourth photoresist pattern as a mask, the impurity semiconductor material and the conductive material to form a first ohmic contact layer, a second ohmic contact layer, a drain electrode, and a source electrode; and forming a pixel electrode which is connected to one of the drain electrode and the source electrode.

The hydrophobizating of the third photoresist pattern may include exposing the third photoresist pattern to NF$_3$.

Each of the first ohmic contact layer and the second ohmic contact layer may have an impurity concentration of about $2*10^{21}$ atom/cm$^3$ or higher.

The forming of the first ohmic contact layer, the second ohmic contact layer, the drain electrode, and the source electrode may include: forming the fourth photoresist pattern above the conductive material; and patterning, using the fourth photoresist pattern as a mask, the conductive material and the impurity semiconductor material in a wet etching method to form the first ohmic contact layer, the second ohmic contact layer, the drain electrode, and the source electrode.

According to another embodiment of the present inventive concept, a method of manufacturing a liquid crystal display device includes: forming a gate electrode above a substrate; forming a gate insulating layer above the gate electrode; forming a semiconductor material above the gate insulating layer; forming a first photoresist pattern and a second photoresist pattern above the semiconductor material, the second photoresist pattern having a smaller thickness than a thickness of the first photoresist pattern; patterning, using the first photoresist pattern and the second photoresist pattern as a mask, the semiconductor material to form a semiconductor layer which overlaps the gate electrode; removing a portion of the first photoresist pattern and the second photoresist pattern to form a third photoresist pattern which is disposed to correspond to a channel area of the semiconductor layer; forming an impurity semiconductor material above the gate insulating layer, the semiconductor layer, and the third photoresist pattern; removing the third photoresist pattern and the impurity semiconductor material above the third photoresist pattern in a lift-off method; forming a conductive material above the impurity semiconductor material and the semiconductor layer; patterning, using a fourth photoresist pattern as a mask, the impurity semiconductor material and the conductive material to form a first ohmic contact layer, a second ohmic contact layer, a drain electrode, and a source electrode; and forming a pixel electrode which is connected to one of the drain electrode and the source electrode.

Each of the first ohmic contact layer and the second ohmic contact layer may have an impurity concentration of about $2*10^{21}$ atom/cm$^3$ or higher.

The forming of the first ohmic contact layer, the second ohmic contact layer, the drain electrode, and the source electrode may include: forming the fourth photoresist pattern above the conductive material; and patterning, using the fourth photoresist pattern as a mask, the conductive material and the impurity semiconductor material in a wet etching method to form the first ohmic contact layer, the second ohmic contact layer, the drain electrode, and the source electrode.

According to still another embodiment of the present inventive concept, a method of manufacturing a liquid crystal display device includes: forming a gate electrode above a substrate; forming a gate insulating layer above the gate electrode; forming a semiconductor material above the gate insulating layer; forming a first photoresist pattern above the semiconductor material; patterning, using the first photoresist pattern as a mask, the semiconductor material to form a semiconductor layer which overlaps the gate electrode; hydrophobizating the first photoresist pattern; forming an impurity semiconductor material above an inclined surface of the semiconductor layer and the gate insulating layer using the first photoresist pattern that is hydrophobizated as a mask; removing the first photoresist pattern; forming a conductive material above the impurity semiconductor material and the semiconductor layer; patterning, using a second photoresist pattern as a mask, the impurity semiconductor material and the conductive material to form a first ohmic contact layer, a second ohmic contact layer, a drain electrode, and a source electrode; and forming a pixel electrode which is connected to one of the drain electrode and the source electrode.

The hydrophobizating of the first photoresist pattern may include exposing the first photoresist pattern to $NF_3$.

Each of the first ohmic contact layer and the second ohmic contact layer may have an impurity concentration of about $2*10^{21}$ atom/cm$^3$ or higher.

The forming of the first ohmic contact layer, the second ohmic contact layer, the drain electrode, and the source electrode may include: forming a third photoresist pattern above the conductive material; and patterning, using the third photoresist pattern as a mask, the conductive material and the impurity semiconductor material in a wet etching method to form the first ohmic contact layer, the second ohmic contact layer, the drain electrode, and the source electrode.

The foregoing is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and aspects of the present disclosure of inventive concept will be more clearly understood from the following detailed description taken in conjunction with the accompanying drawings, in which.

DETAILED DESCRIPTION

Figure 1:
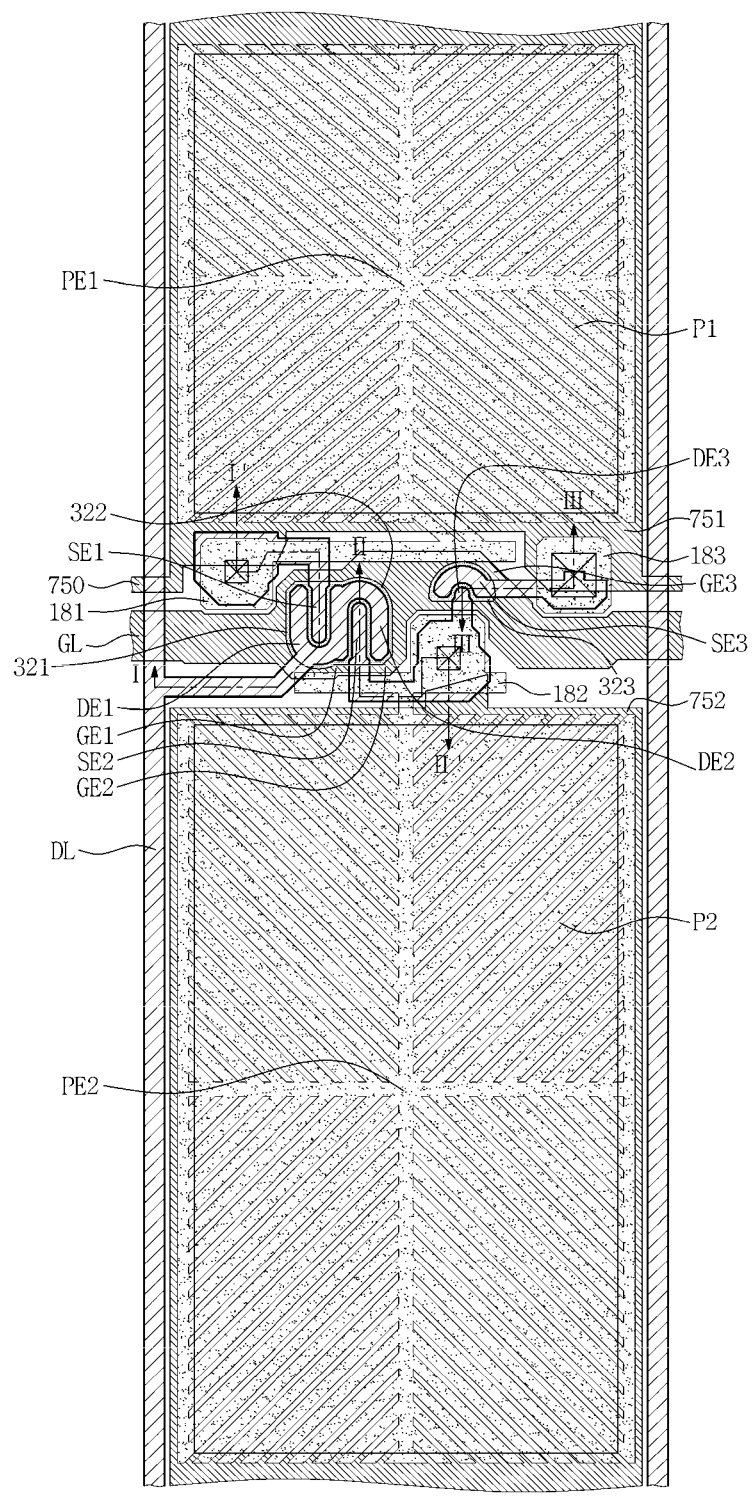
FIG. 1 is a plan view illustrating a pixel according to an exemplary embodiment.

Exemplary embodiments will now be described more fully hereinafter with reference to the accompanying drawings. Although the inventive concept can be modified in various manners and have several embodiments, exemplary embodiments are illustrated in the accompanying drawings and will be mainly described in the specification. However, the scope of the inventive concept is not limited to the exemplary embodiments and should be construed as including all the changes, equivalents, and substitutions included in the spirit and scope of the inventive concept.

In the drawings, certain elements or shapes may be illustrated in an enlarged manner or in a simplified manner to better illustrate the inventive concept, and other elements present in an actual product may also be omitted. Thus, the drawings are intended to facilitate the understanding of the present inventive concept.

When a layer, area, or plate is referred to as being "on" another layer, area, or plate, it may be directly on the other layer, area, or plate, or intervening layers, areas, or plates may be present therebetween. Conversely, when a layer, area, or plate is referred to as being "directly on" another layer, area, or plate, intervening layers, areas, or plates may be absent therebetween. Further when a layer, area, or plate is referred to as being "below" another layer, area, or plate, it may be directly below the other layer, area, or plate, or intervening layers, areas, or plates may be present therebetween. Conversely, when a layer, area, or plate is referred to as being "directly below" another layer, area, or plate, intervening layers, areas, or plates may be absent therebetween.

The spatially relative terms "below", "beneath", "less", "above", "upper", and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device shown in the drawing is turned over, the device positioned "below" or "beneath" another device may be placed "above" another device. Accordingly, the illustrative term "below" may include both the lower and upper positions. The device may also be oriented in the other direction, and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" can be termed likewise without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms used herein (including technical and scientific terms) have the same meaning as commonly understood by those skilled in the art to which this inventive concept pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Hereinafter, an exemplary embodiment of a liquid crystal display (LCD) device and a method of manufacturing the LCD device will be described with reference to FIGS. 1 to 9H.

Figure 2:
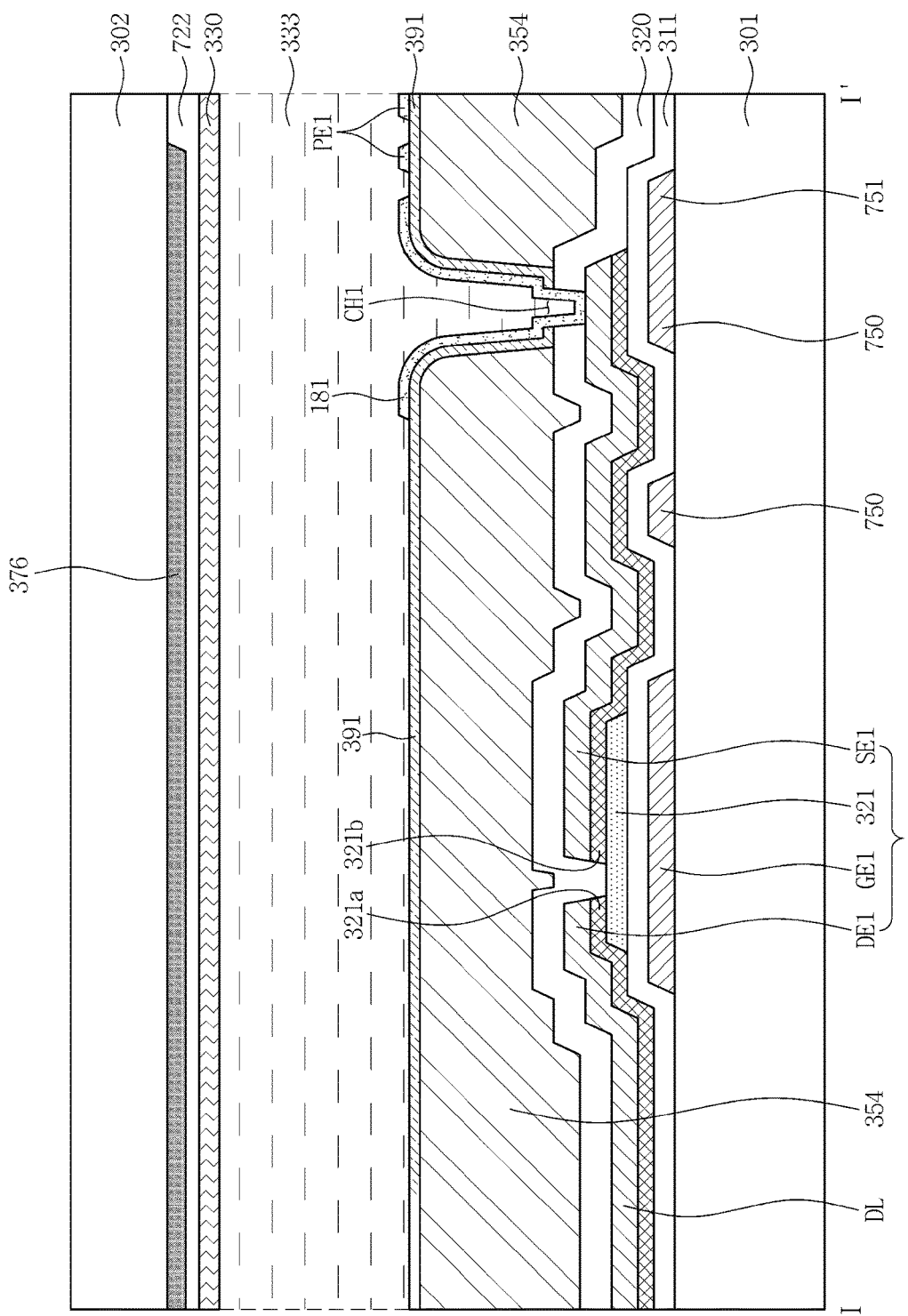
FIG. 2 is a cross-sectional view taken along line I-I' of FIG. 1.
Figure 3:
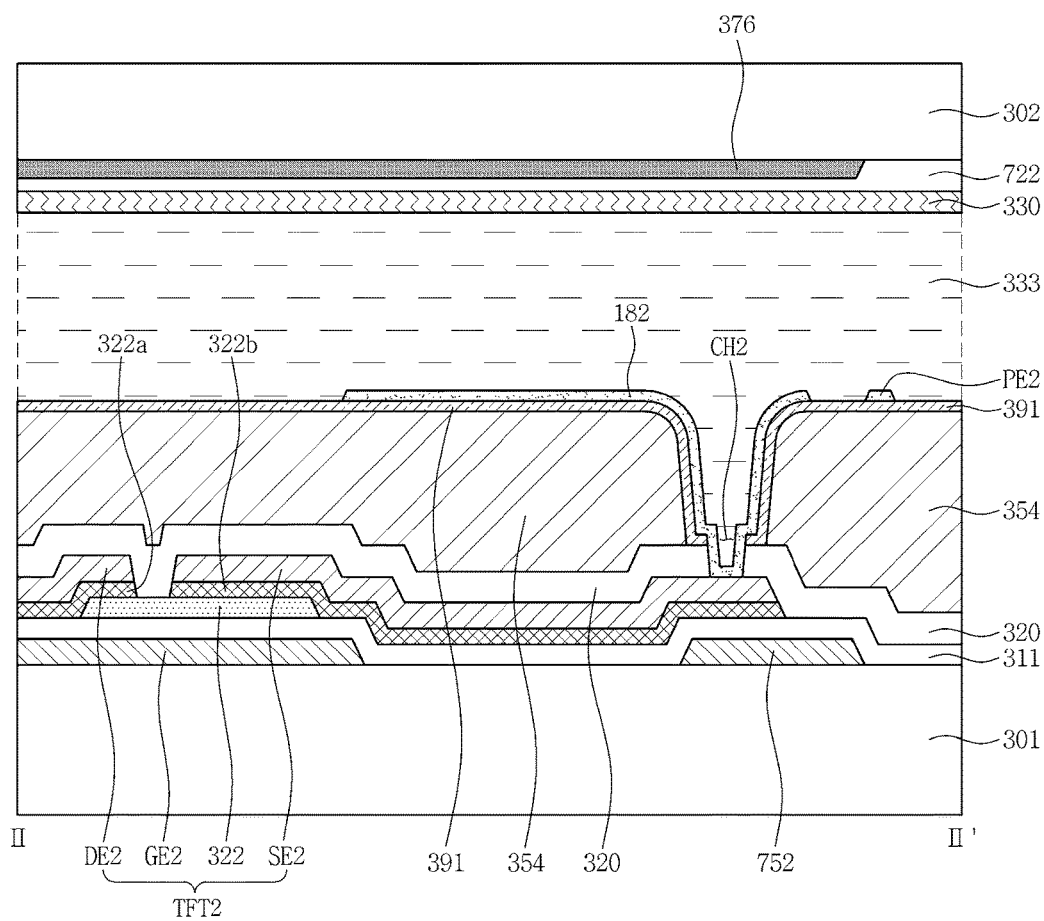
FIG. 3 is a cross-sectional view taken along line II-IT of FIG. 1.
Figure 4:
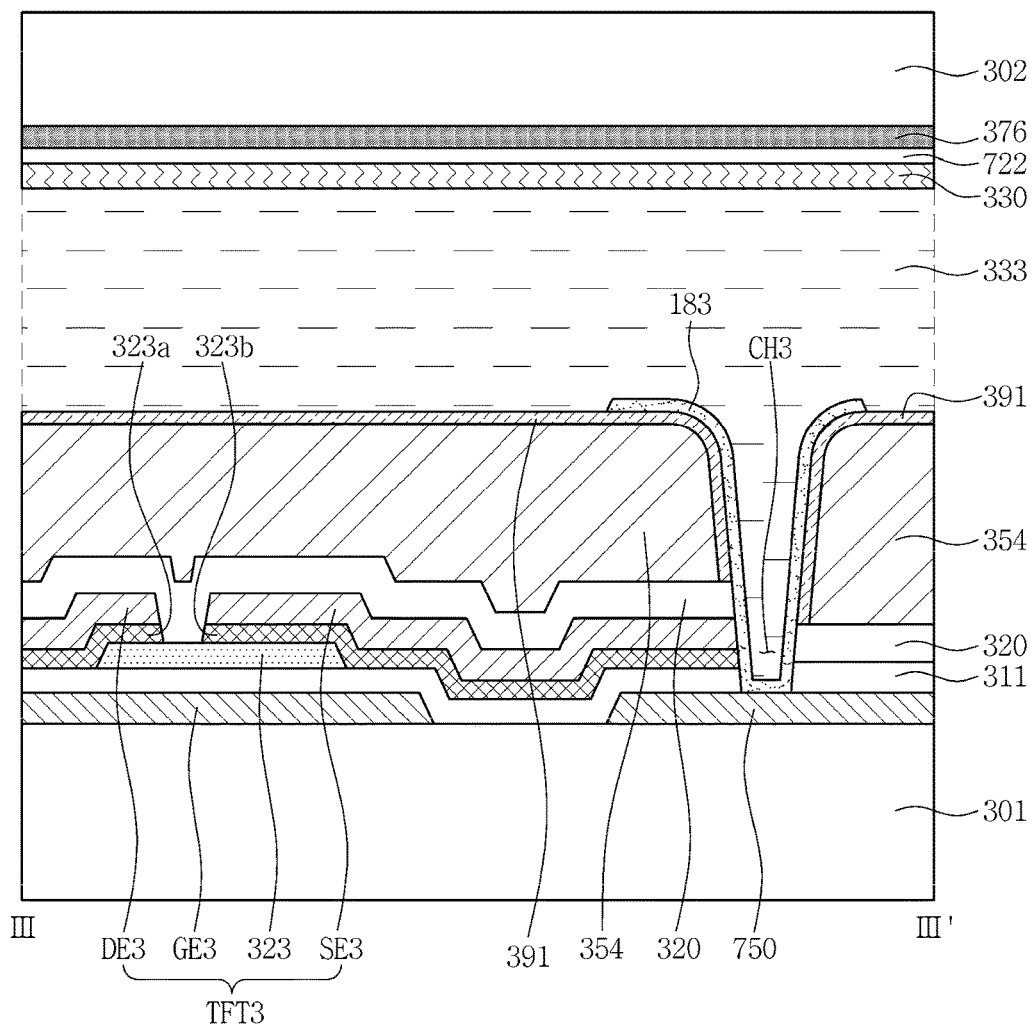
FIG. 4 is a cross-sectional view taken along line III-III' of FIG. 1.

FIG. 1 is a plan view illustrating a pixel according to an exemplary embodiment, FIG. 2 is a cross-sectional view taken along line I-I' of FIG. 1, FIG. 3 is a cross-sectional view taken along line II-IT of FIG. 1, and FIG. 4 is a cross-sectional view taken along line III-III' of FIG. 1.

The LCD device, as illustrated in FIGS. 1, 2, 3, and 4, includes a first substrate 301, a gate line GL, a first gate electrode GE1, a second gate electrode GE2, a third gate electrode GE3, a first storage electrode 751, a storage line 750, a second storage electrode 752, a gate insulating layer 311, a first semiconductor layer 321, a second semiconductor layer 322, a third semiconductor layer 323, a first ohmic contact layer 321a, a second ohmic contact layer 321b, a data line DL, a first drain electrode DE1, a first source electrode SE1, a second drain electrode DE2, a second source electrode SE2, a third drain electrode DE3, a third source electrode SE3, a passivation layer 320, a capping layer 391, a color filter 354, pixel electrodes PE1 and PE2, a second substrate 302, a light blocking layer 376, an overcoat layer 722, a common electrode 330, and a liquid crystal layer 333. Herein, the pixel electrodes PE1 and PE2 include a first sub-pixel electrode PE1 disposed in a first sub-pixel area P1 and a second sub-pixel electrode PE2 disposed in a second sub-pixel area P2.

The first switching element TFT1, as illustrated in FIGS. 1 and 2, includes the first gate electrode GE1, the first semiconductor layer 321, the first drain electrode DE1, and the first source electrode SE1.

The second switching element TFT2, as illustrated in FIGS. 1 and 3, includes the second gate electrode GE2, the second semiconductor layer 322, the second drain electrode DE2, and the second source electrode SE2.

As illustrated in FIGS. 1 and 2, the gate line GL is disposed above the first substrate 301. For example, the gate line GL is disposed between the first sub-pixel area P1 and the second sub-pixel area P2 of the first substrate 301 in a plan view.

The gate line GL, as illustrated in FIGS. 1, 2, 3, and 4, is connected to the first gate electrode GE1, the second gate electrode GE2, and the third gate electrode GE3. The gate line GL, the first gate electrode GE1, the second gate electrode GE2, and the third gate electrode GE3 may be unitary. In an exemplary embodiment, although not illustrated, a pad portion (e.g., an end portion) of the gate line GL may have a greater planar area than a planar area of another portion thereof so as to properly contact another layer or an external driving circuit.

The gate line GL may include or be formed of aluminum (Al) or alloys thereof, silver (Ag) or alloys thereof, copper (Cu) or alloys thereof, and/or molybdenum (Mo) or alloys thereof. In an exemplary embodiment, the gate line GL may include or be formed of one of chromium (Cr), tantalum (Ta), and titanium (Ti). In an exemplary embodiment, the gate line GL may have a multilayer structure including at least two conductive layers that have different physical properties from one another.

The first gate electrode GE1 may be a portion of the gate line GL. Dissimilarly thereto, the first gate electrode GE1 may have a shape protruding from the gate line GL. As illustrated in FIGS. 1 and 2, the first gate electrode GE1 overlaps the first semiconductor layer 321. The first gate electrode GE1 may include the same material and may have the same structure (multilayer structure) as those of the gate line GL. The first gate electrode GE1 and the gate line GL may be simultaneously formed in the same process.

The second gate electrode GE2 may be a portion of the gate line GL. Dissimilarly thereto, the second gate electrode GE2 may have a shape protruding from the gate line GL. As illustrated in FIGS. 1 and 3, the second gate electrode GE2 overlaps the second semiconductor layer 322. The second gate electrode GE2 may include the same material and may have the same structure (multilayer structure) as those of the gate line GL. The second gate electrode GE2 and the gate line GL may be simultaneously formed in the same process.

The third gate electrode GE3 may be a portion of the gate line GL. Dissimilarly thereto, the third gate electrode GE3 may have a shape protruding from the gate line GL. As illustrated in FIGS. 1 and 4, the third gate electrode GE3 overlaps the third semiconductor layer 323. The third gate electrode GE3 may include the same material and may have the same structure (multilayer structure) as those of the gate line GL. The third gate electrode GE3 and the gate line GL may be simultaneously formed in the same process.

The first storage electrode 751, as illustrated in FIG. 1, encloses the first sub-pixel electrode PE1. In such an exemplary embodiment, the first storage electrode 751 may overlap an edge portion of the first sub-pixel electrode PE1. A first storage voltage Vcst1 is applied to the first storage electrode 751. The first storage voltage Vcst1 may have a voltage level the same as that of a common voltage Vcom. The first storage electrode 751 may include the same material and have the same structure (multilayer structure) as those of the gate line GL. The first storage electrode 751 and the gate line GL may be simultaneously formed in the same process.

The first storage electrode 751 is connected to the storage line 750. The storage line 750, as illustrated in FIG. 1, is disposed between the first sub-pixel area P1 and the second sub-pixel area P2. The storage line 750 is substantially parallel to the gate line GL. The first storage voltage Vcst1 is applied to the storage line 750. In such an exemplary embodiment, the first storage electrode 751 and the storage line 750 may be unitary. The storage line 750 may include the same material and have the same structure (multilayer structure) as those of the gate line GL. In an exemplary embodiment, the storage line 750 and the gate line GL may be simultaneously formed in the same process.

The second storage electrode 752, as illustrated in FIG. 1, encloses the second sub-pixel electrode PE2. In such an exemplary embodiment, the second storage electrode 752 overlaps an edge portion of the second sub-pixel electrode PE2. A second storage voltage Vcst2 is applied to the second storage electrode 752. The second storage voltage Vcst2 may have a voltage level the same as that of the common voltage Vcom. In an exemplary embodiment, the second storage electrode 752 and the first storage electrode 751 may be unitary. The second storage electrode 752 may include the same material and have the same structure (multilayer structure) as those of the gate line GL. The second storage electrode 752 and the gate line GL may be simultaneously formed in the same process.

The gate insulating layer 311, as illustrated in FIGS. 2 and 3, is disposed above the gate line GL, the first gate electrode GE1, the second gate electrode GE2, the first storage electrode 751, the second storage electrode 752, and the storage line 750. In such an exemplary embodiment, the gate insulating layer 311 is disposed over an entire surface of the first substrate 301 including the gate line GL, the first gate electrode GE1, the second gate electrode GE2, the first storage electrode 751, the second storage electrode 752, and the storage line 750. The gate insulating layer 311 has a gate contact hole passing through a portion of the gate insulating layer 311. The storage line 750 is exposed through the gate contact hole. The gate insulating layer 311 may include or be formed of silicon nitride ($SiN_x$) or silicon oxide ($SiO_x$), for example. The gate insulating layer 311 may have a multilayer structure including at least two insulating layers that have different physical properties from one another.

The gate insulating layer 311 may include fluorine (F). For example, the gate insulating layer 311 may include fluorine atoms at a concentration of about $10^{18}$ atom/cm$^3$ or higher. A concentration of the fluorine (F) is decreasing, as the fluorine (F) of the gate insulating layer 311 being more adjacent to the first substrate 301.

The gate insulating layer 311 may include fluorine (F) at lower concentration, as being more adjacent to the first substrate 301. That is, the gate insulating layer 311 may have a fluorine (F) concentration that varies in the vertical (depth) direction. For example, a portion of the gate insulating layer 311 relatively adjacent to the first substrate 301 has a relatively low concentration of fluorine (F), while another portion of the gate insulating layer 311 relatively distanced from the first substrate 301 has a relatively high concentration of fluorine (F). For example, the portion of the gate insulating layer 311 relatively adjacent to the first substrate 301 may include fluorine atoms at a concentration of about $10^{18}$ atom/cm$^3$, and the another portion of the gate insulating layer 311 relatively distanced from the first substrate 301 may include fluorine atoms at a concentration higher than about $10^{18}$ atom/cm$^{3O}$.

The data line DL, as illustrated in FIG. 2, is disposed above the gate insulating layer 311. Although not illustrated, a pad portion (e.g., an end portion) of the data line DL may have a greater planar area than a planar area of another portion thereof so as to properly contact another layer or an external driving circuit.

The data line DL intersects the gate line GL and the storage line 750. Although not illustrated, a portion of the data line DL that intersects the gate line GL may have a smaller line width than a line width of another portion of the data line DL. Similarly thereto, a portion of the data line DL that intersects the storage line 750 may have a smaller line width than a line width of another portion of the data line DL. Accordingly, a parasitic capacitance between the data line DL and the gate line GL and a capacitance between the data line DL and the storage line 750 may be reduced.

The data line DL may include or be formed of refractory metal, such as molybdenum, chromium, tantalum, and titanium, or an alloy thereof. The data line DL may have a multilayer structure including a refractory metal layer and a low-resistance conductive layer. Examples of the multilayer structure may include: a double-layer structure including a chromium or molybdenum (alloy) lower layer and an aluminum (alloy) upper layer; and a triple-layer structure including a molybdenum (alloy) lower layer, an aluminum (alloy) intermediate layer, and a molybdenum (alloy) upper layer. In an alternative exemplary embodiment, the data line DL may include or be formed of any suitable metals or conductors rather than the aforementioned materials.

The first semiconductor layer 321, as illustrated in FIG. 2, is disposed above the gate insulating layer 311. The first semiconductor layer 321, as illustrated in FIGS. 1 and 2, overlaps the first gate electrode GE1. The first semiconductor layer 321 may include or be formed of, for example, amorphous silicon or polycrystalline silicon. Herein, each of the amorphous silicon and the polycrystalline silicon may further include hydrogen (H).

A channel area of the first semiconductor layer 321 may have substantially the same thickness as a thickness of a thickest portion of a non-channel area of the first semiconductor layer 321. In other words, an upper surface of the first semiconductor layer 321 is substantially flat. That is, in the case that a surface of the first semiconductor 321 that faces (or contacts) the gate insulating layer 311 is defined as a lower surface of the first semiconductor layer 321 and a surface of the first semiconductor layer 321 that is opposite to the aforementioned lower surface is defined as an upper surface of the first semiconductor layer 321, the upper surface of the first semiconductor layer 321 is substantially flat. In an exemplary embodiment, the aforementioned channel area of the first semiconductor layer 321 refers to an area of the first semiconductor layer 321 corresponding to a channel area of the first switching element TFT1.

The second semiconductor layer 322, as illustrated in FIG. 3, is disposed above the gate insulating layer 311. The second semiconductor layer 322, as illustrated in FIGS. 1 and 3, overlaps the second gate electrode GE2. The second semiconductor layer 322 may include or be formed of the same material as that included in the first semiconductor layer 321. The second semiconductor layer 322 and the first semiconductor layer 321 may be simultaneously formed in the same process. As illustrated in FIG. 1, the second semiconductor layer 322 and the first semiconductor layer 321 may be unitary.

A channel area of the second semiconductor layer 322 may have substantially the same thickness as a thickness of a thickest portion of a non-channel area of the second semiconductor layer 322. In other words, an upper surface of the second semiconductor layer 322 is substantially flat. That is, in the case that a surface of the second semiconductor 322 that faces (or contacts) the gate insulating layer 311 is defined as a lower surface of the second semiconductor layer 322 and a surface of the second semiconductor layer 322 that is opposite to the aforementioned lower surface is defined as an upper surface of the second semiconductor layer 322, the upper surface of the second semiconductor layer 322 is substantially flat. In an exemplary embodiment, the aforementioned channel area of the second semiconductor layer 322 refers to an area of the second semiconductor layer 322 corresponding to a channel area of the second switching element TFT2.

The third semiconductor layer 323, as illustrated in FIG. 4, is disposed above the gate insulating layer 311. The third semiconductor layer 323, as illustrated in FIGS. 1 and 4, overlaps the third gate electrode GE3. The third semiconductor layer 323 may include the same material as that included in the first semiconductor layer 321. The third semiconductor layer 323 and the first semiconductor layer 321 may be simultaneously formed in the same process.

A channel area of the third semiconductor layer 323 may have substantially the same thickness as a thickness of a thickest portion of a non-channel area of the third semiconductor layer 323. In other words, an upper surface of the third semiconductor layer 323 is substantially flat. That is, in the case that a surface of the third semiconductor layer 323 that faces (or contacts) the gate insulating layer 311 is defined as a lower surface of the third semiconductor layer 323 and a surface of the third semiconductor layer 323 that is opposite to the aforementioned lower surface is defined as an upper surface of the third semiconductor layer 323, the upper surface of the third semiconductor layer 323 is substantially flat. In an exemplary embodiment, the aforementioned channel area of the third semiconductor layer 323 refers to an area of the third semiconductor layer 323 corresponding to a channel area of the third switching element TFT3.

The first and second ohmic contact layers 321a and 321b, as illustrated in FIG. 2, are disposed above the first semiconductor layer 321. The first and second ohmic contact layers 321a and 321b face each other, having the channel area of the first switching element TFT1 therebetween. At least one of the first ohmic contact layer 321a and the second ohmic contact layer 321b may include or be formed of n+ hydrogenated amorphous silicon doped with n-type impurities, such as phosphorus (P) or hydrogen phosphide ($PH_3$), at high concentration. For example, at least one of the first ohmic contact layer 321a and the second ohmic contact layer 321b may include impurities (phosphorus (P) or hydrogen phosphide ($PH_3$)) at a concentration of about $2*10^{21}$ atom/cm$^3$ or higher. In an alternative exemplary embodiment, at least one of the first ohmic contact layer 321a and the second ohmic contact layer 321b may include silicide.

The first ohmic contact layer 321a is disposed between the first semiconductor layer 321 and the first drain electrode DE1, between the gate insulating layer 311 and the first drain electrode DE1, and between the gate insulating layer 311 and the data line DL. In other words, a portion of the first ohmic contact layer 321a is disposed between the first semiconductor layer 321 and the first drain electrode DE1, another portion of the first ohmic contact layer 321a is disposed between the gate insulating layer 311 and the first drain electrode DE1, and still another portion of the first ohmic contact layer 321a is disposed between the gate insulating layer 311 and the data line DL. In such an exemplary embodiment, the portion of the first ohmic contact layer 321a between the gate insulating layer 311 and the first drain electrode DE1 contacts the gate insulating layer 311. In addition, the portion of the first ohmic contact layer 321a between the gate insulating layer 311 and the data line DL contacts the gate insulating layer 311. In other words, a portion of the first ohmic contact layer 321a substantially immediately above the gate insulating layer 311 directly contacts the gate insulating layer 311.

The second ohmic contact layer 321b is disposed between the first semiconductor layer 321 and the first source electrode SE1 and between the gate insulating layer 311 and the first source electrode SE1. In other words, a portion of the second ohmic contact layer 321b is disposed between the first semiconductor layer 321 and the first source electrode SE1, and another portion of the second ohmic contact layer 321b is disposed between the gate insulating layer 311 and the first source electrode SE1. In such an exemplary embodiment, the portion of the second ohmic contact layer 321b between the gate insulating layer 311 and the first source electrode SE1 contacts the gate insulating layer 311. In other words, a portion of the second ohmic contact layer 321b substantially immediately above the gate insulating layer 311 directly contacts the gate insulating layer 311.

Third and fourth ohmic contact layers 322a and 322b, as illustrated in FIG. 3, are disposed above the second semiconductor layer 322. The third and fourth ohmic contact layers 322a and 322b face each other, having the channel area of the second switching element TFT2 therebetween. The third and fourth ohmic contact layers 322a and 322b may include the same material as that included in the aforementioned first ohmic contact layer 321a. In an exemplary embodiment, the third ohmic contact layer 322*a* and the second ohmic contact layer 321*b* may be unitary.

The third ohmic contact layer 322*a* is disposed between the second semiconductor layer 322 and the second drain electrode DE2 and between the gate insulating layer 311 and the second drain electrode DE2. In other words, a portion of the third ohmic contact layer 322*a* is disposed between the second semiconductor layer 322 and the second drain electrode DE2, and another portion of the third ohmic contact layer 322*a* is disposed between the gate insulating layer 311 and the second drain electrode DE2. In such an exemplary embodiment, the portion of the third ohmic contact layer 322*a* between the gate insulating layer 311 and the second drain electrode DE2 contacts the gate insulating layer 311. In other words, a portion of the third ohmic contact layer 322*a* substantially immediately above the gate insulating layer 311 directly contacts the gate insulating layer 311.

The fourth ohmic contact layer 322*b* is disposed between the second semiconductor layer 322 and the second source electrode SE2 and between the gate insulating layer 311 and the second source electrode SE2. In other words, a portion of the fourth ohmic contact layer 322*b* is disposed between the second semiconductor layer 322 and the second source electrode SE2, and another portion of the fourth ohmic contact layer 322*b* is disposed between the gate insulating layer 311 and the second source electrode SE2. In such an exemplary embodiment, the portion of the fourth ohmic contact layer 322*b* between the gate insulating layer 311 and the second source electrode SE2 contacts the gate insulating layer 311. In other words, a portion of the fourth ohmic contact layer 322*b* substantially immediately above the gate insulating layer 311 directly contacts the gate insulating layer 311.

Fifth and sixth ohmic contact layers 323*a* and 323*b*, as illustrated in FIG. 4, are disposed above the third semiconductor layer 323. The fifth and sixth ohmic contact layers 323*a* and 323*b* face each other, having the channel area of the third switching element TFT3 therebetween. The fifth and sixth ohmic contact layers 323*a* and 323*b* may include the same material as that included in the first ohmic contact layer 321*a*.

The fifth ohmic contact layer 323*a* is disposed between the third semiconductor layer 323 and the third drain electrode DE3 and between the gate insulating layer 311 and the third drain electrode DE3. In other words, a portion of the fifth ohmic contact layer 323*a* is disposed between the third semiconductor layer 323 and the third drain electrode DE3, and another portion of the fifth ohmic contact layer 323*a* is disposed between the gate insulating layer 311 and the third drain electrode DE3. In such an exemplary embodiment, the portion of the fifth ohmic contact layer 323*a* between the gate insulating layer 311 and the third drain electrode DE3 contacts the gate insulating layer 311. In other words, a portion of the fifth ohmic contact layer 323*a* substantially immediately above the gate insulating layer 311 directly contacts the gate insulating layer 311.

The sixth ohmic contact layer 323*b* is disposed between the third semiconductor layer 323 and the third source electrode SE3 and between the gate insulating layer 311 and the third source electrode SE3. In other words, a portion of the sixth ohmic contact layer 323*b* is disposed between the third semiconductor layer 323 and the third source electrode SE3, and another portion of the sixth ohmic contact layer 323*b* is disposed between the gate insulating layer 311 and the third source electrode SE3. In such an exemplary embodiment, the portion of the sixth ohmic contact layer 323*b* between the gate insulating layer 311 and the third source electrode SE3 contacts the gate insulating layer 311. In other words, a portion of the sixth ohmic contact layer 323*b* substantially immediately above the gate insulating layer 311 directly contacts the gate insulating layer 311.

The first, second, third, fourth, fifth, and sixth ohmic contact layers 321*a*, 321*b*, 322*a*, 322*b*, 323*a*, and 323*b* may be simultaneously formed in the same process.

The first drain electrode DE1, as illustrated in FIG. 2, is disposed above the first ohmic contact layer 321*a*. The first drain electrode DE1, as illustrated in FIG. 1, may have a shape protruding from the data line DL. Although not illustrated, the first drain electrode DE1 may be a portion of the data line DL. The first drain electrode DE1 overlaps the first semiconductor layer 321 and the first gate electrode GE1. The first drain electrode DE1 may have a shape selected from an I-shape, a C-shape, and a U-shape. The first drain electrode DE1 having a U-shape is illustrated in FIG. 1, and a protruding portion of the first drain electrode DE1 faces toward the second sub-pixel electrode PE2. The first drain electrode DE1 may include the same material and may have the same structure (multilayer structure) as those of the data line DL. The first drain electrode DE1 and the data line DL may be simultaneously formed in the same process.

The first drain electrode DE1 and the data line DL are disposed along the first ohmic contact layer 321*a*. A data transmitting wiring which includes the first drain electrode DE1 and the data line DL may have the same shape as that of the first ohmic contact layer 321*a*.

The first source electrode SE1, as illustrated in FIG. 2, is disposed above the second ohmic contact layer 321*b*. The first source electrode SE1 overlaps the first semiconductor layer 321 and the first gate electrode GE1. The first source electrode SE1 is connected to the first sub-pixel electrode PE1 through a first connecting electrode 181. The first source electrode SE1 may include the same material and may have the same structure (multilayer structure) as those of the data line DL. The first source electrode SE1 and the data line DL may be simultaneously formed in the same process.

The first source electrode SE1 is disposed along the second ohmic contact layer 321*b*. The first source electrode SE1 may have substantially the same shape as that of the first ohmic contact layer 321*a*.

The second drain electrode DE2, as illustrated in FIG. 3, is disposed above the third ohmic contact layer 322*a*. The second drain electrode DE2 and the first drain electrode DE1 are unitary. The second drain electrode DE2 overlaps the second semiconductor layer 322 and the second gate electrode GE2. The second drain electrode DE2 may have a shape selected from an I-shape, a C-shape, and a U-shape. The second drain electrode DE2 having a U-shape is illustrated in FIG. 1, and a protruding portion of the second drain electrode DE2 faces toward the first sub-pixel electrode PE1. The second drain electrode DE2 may include the same material and may have the same structure (multilayer structure) as those of the data line DL. In an exemplary embodiment, the second drain electrode DE2 and the data line DL may be simultaneously formed in the same process.

The second drain electrode DE2 is disposed along the third ohmic contact layer 322*a*. The second drain electrode DE2 may have substantially the same shape as that of the third ohmic contact layer 322*a*.

The second source electrode SE2, as illustrated in FIG. 3, is disposed above the fourth ohmic contact layer 322*b*. The second source electrode SE2 overlaps the second semiconductor layer 322 and the second gate electrode GE2. The second source electrode SE2 is connected to the second sub-pixel electrode PE2 through a second connecting electrode 182. The second source electrode SE2 may include the same material and may have the same structure (multilayer structure) as those of the data line DL. The second source electrode SE2 and the data line DL may be simultaneously formed in the same process.

The second source electrode SE2 is disposed along the fourth ohmic contact layer 322b. The second source electrode SE2 may have substantially the same shape as that of the fourth ohmic contact layer 322b.

The third drain electrode DE3, as illustrated in FIG. 4, is disposed above the fifth ohmic contact layer 323a. The third drain electrode DE3 and the second source electrode SE2 are unitary. The third drain electrode DE3 overlaps the third semiconductor layer 323 and the third gate electrode GE3. The third drain electrode DE3 may have a shape selected from an I-shape, a C-shape, and a U-shape. The third drain electrode DE3 having an I-shape is illustrated in FIG. 1. The third drain electrode DE3 may include the same material and may have the same structure (multilayer structure) as those of the data line DL. In an exemplary embodiment, the third drain electrode DE3 and the data line DL may be simultaneously formed in the same process.

The third drain electrode DE3 is disposed along the fifth ohmic contact layer 323a. The third drain electrode DE3 may have substantially the same shape as that of the fifth ohmic contact layer 323a.

The third source electrode SE3, as illustrated in FIG. 4, is disposed above the sixth ohmic contact layer 323b. The third source electrode SE3 overlaps the third semiconductor layer 323 and the third gate electrode GE3. The third source electrode SE3 is connected to the storage line 750 through a third connecting electrode 183. The third source electrode SE3 may include the same material and may have the same structure (multilayer structure) as those of the aforementioned data line DL. In an exemplary embodiment, the third source electrode SE3 and the data line DL may be simultaneously formed in the same process.

The third source electrode SE3 is disposed along the sixth ohmic contact layer 323b. The third source electrode SE3 may have substantially the same shape as that of the sixth ohmic contact layer 323b.

The passivation layer 320, as illustrated in FIGS. 2, 3, and 4, is disposed above the data line DL, the first drain electrode DE1, the second drain electrode DE2, the third drain electrode DE3, the first source electrode SE1, the second source electrode SE2, and the third source electrode SE3. In such an exemplary embodiment, the passivation layer 320 is disposed over the entire surface of the first substrate 301 including the data line DL, the first drain electrode DE1, the second drain electrode DE2, the third drain electrode DE3, the first source electrode SE1, the second source electrode SE2, and the third source electrode SE3. The passivation layer 320 has first, second, and third lower contact holes passing through a portion of the passivation layer 320. A top surface of the first source electrode SE1 is externally exposed through the first lower contact hole, a top surface of the second source electrode SE2 is externally exposed through the second lower contact hole, and a top surface and a side surface of the third source electrode SE3 is externally exposed through the third lower contact hole.

The passivation layer 320 may include or be formed of an inorganic insulating material such as silicon nitride ($SiN_x$) or silicon oxide ($SiO_x$). The passivation layer 320 may include or be formed of an organic insulating material. In such an exemplary embodiment, an organic insulating material having photosensitivity and having a dielectric constant of about 4.0 may be used. In an alternative exemplary embodiment, the passivation layer 320 may have a double-layer structure including a lower inorganic layer and an upper organic layer, which has been found to impart desirable insulating properties and also to prevent damage to exposed portions of the first, second, and third semiconductor layers 321, 322, and 323. The passivation layer 320 may have a thickness greater than or equal to about 5000 Å, for example, in a range of about 6000 Å to about 8000 Å.

The color filter 354, as illustrated in FIGS. 2, 3, and 4, is disposed above the passivation layer 320. The color filter 354 is disposed in the first sub-pixel area P1 and the second sub-pixel area P2. In addition, the color filter 354 may further be disposed above the passivation layer 320 between the first sub-pixel area P1 and the second sub-pixel area P2. In such an exemplary embodiment, the color filter 354 may be removed in the first, second, and third contact holes CH, CH2, and CH3. In an exemplary embodiment, an edge portion of one of the color filters 354 may overlap an edge portion of another of the color filters 354 that is adjacent thereto. Color filters 354 having the same color are respectively disposed in the first sub-pixel area P1 and the second sub-pixel area P2 that are included in the same pixel. The color filter 354 may include or be formed of a photosensitive organic material.

The capping layer 391, as illustrated in FIGS. 2, 3, and 4, is disposed above the color filter 354. The capping layer 391 is configured to prevent permeation of undesirable materials, generated in the color filter 354, into the liquid crystal layer 333. The capping layer 391 has first, second, and third upper contact holes passing therethrough. The first upper contact hole is disposed above the first lower contact hole which exposes the first source electrode SE1. The first upper contact hole is connected to the first lower contact hole, thereby forming the first contact hole CH1. The second upper contact hole is disposed above the second lower contact hole which exposes the second source electrode SE2. The second upper contact hole is connected to the second lower contact hole, thereby forming the second contact hole CH2. The third upper contact hole is disposed above the third lower contact hole which exposes the third source electrode SE3. The third upper contact hole, the third lower contact hole, and the gate contact hole are connected to one another, thereby forming the third contact hole CH3. The capping layer 391 may include or be formed of silicon nitride or silicon oxide.

The first sub-pixel electrode PE1, as illustrated in FIGS. 1 and 2, is disposed in the first sub-pixel area P1. In such an exemplary embodiment, the first sub-pixel electrode PE1 is disposed above the capping layer 391. The first sub-pixel electrode PE1 is connected to the first source electrode SE1 through the first contact hole CH1.

The first sub-pixel electrode PE1 may include or be formed of a transparent conductive material, such as indium tin oxide ("ITO") or indium zinc oxide ("IZO"). Herein, ITO may be a polycrystalline or monocrystalline material, and IZO may be a polycrystalline or monocrystalline material as well. In an alternative exemplary embodiment, IZO may be an amorphous material.

Hereinafter, the first sub-pixel electrode PE1 will be described in detail with reference to FIG. 5.

Figure 5:
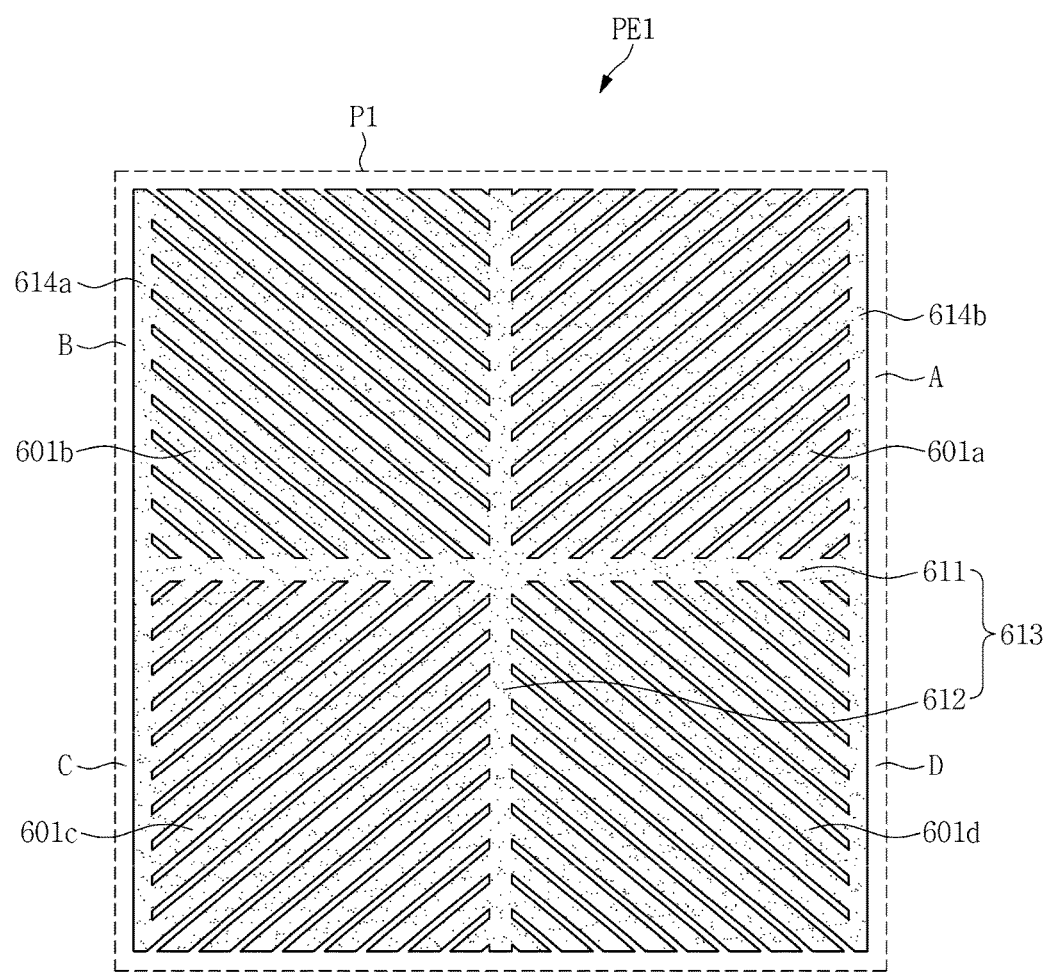
FIG. 5 is a view separately illustrating a first sub-pixel electrode of FIG. 2.

FIG. 5 illustrates the first sub-pixel electrode PE1 of FIG. 2.

The first sub-pixel electrode PE1, as illustrated in FIG. 5, includes a stem electrode 613 and a plurality of branch electrodes 601a, 601b, 601c, and 601d. The stem electrode 613 and the branch electrodes 601a, 601b, 601c, and 601d may be unitary.

The stem electrode 613 divides the first sub-pixel area P1 into a plurality of domains. For example, the stem electrode 613 includes a horizontal portion 611 and a vertical portion 612 which intersect each other. The horizontal portion 611 divides the first sub-pixel area P1 into two domains, and the vertical portion 612 divides each of the divided two domains into another two smaller domains. A pixel area P may be divided into four domains A, B, C, and D by the stem electrode 613 which includes the horizontal portion 611 and the vertical portion 612.

The branch electrodes 601a, 601b, 601c, and 601d include first, second, third, and fourth branch electrodes 601a, 601b, 601c, and 601d extending from the stem electrode 613 into different directions, respectively. That is, the first, second, third, and fourth branch electrodes 601a, 601b, 601c, and 601d extend from the stem electrode 613 into respective ones of the domains A, B, C, and D. For example, the first branch electrode 601a is disposed in the first domain A, the second branch electrode 601b is disposed in the second domain B, the third branch electrode 601c is disposed in the third domain C, and the fourth branch electrode 601d is disposed in the fourth domain D.

The first branch electrode 601a and the second branch electrode 601b may be a line symmetric with respect to the vertical portion 612, and the third branch electrode 601c and the fourth branch electrode 601d may be a line symmetric with respect to the vertical portion 612. In addition, the first branch electrode 601a and the fourth branch electrode 601d may be a line symmetric with respect to the horizontal portion 611, and the second branch electrode 601b and the third branch electrode 601c may be a line symmetric with respect to the horizontal portion 611.

The first branch electrode 601a may include a plurality of first branch electrodes 601a in the first domain A, and in such an exemplary embodiment, the plurality of first branch electrodes 601a are aligned parallel to one another. In this regard, a part of the first branch electrodes 601a connected to the horizontal portion 611 in the first domain A may extend in a diagonal direction with respect to the horizontal portion 611. Further, the other of the first branch electrodes 601a connected to the vertical portion 612 in the first domain A may extend in a diagonal direction with respect to the vertical portion 612.

The second branch electrode 601b may include a plurality of second branch electrodes 601b in the second domain B, and in such an exemplary embodiment, the plurality of second branch electrodes 601b are aligned parallel to one another. In this regard, a part of the second branch electrodes 601b connected to the horizontal portion 611 in the second domain B may extend in a diagonal direction with respect to the horizontal portion 611. Further, the other of the second branch electrodes 601b connected to the vertical portion 612 in the second domain B may extend in a diagonal direction with respect to the vertical portion 612.

The third branch electrode 601c may include a plurality of third branch electrodes 601c in the third domain C, and in such an exemplary embodiment, the plurality of third branch electrodes 601c are aligned parallel to one another. In this regard, a part of the third branch electrodes 601c connected to the horizontal portion 611 in the third domain C may extend in a diagonal direction with respect to the horizontal portion 611. Further, the other of the third branch electrodes 601c connected to the vertical portion 612 in the third domain C may extend in a diagonal direction with respect to the vertical portion 612.

The fourth branch electrode 601d may include a plurality of fourth branch electrodes 601d in the fourth domain D, and in such an exemplary embodiment, the plurality of fourth branch electrodes 601d are aligned parallel to one another. In this regard, a part of the fourth branch electrodes 601d connected to the horizontal portion 611 in the fourth domain D may extend in a diagonal direction with respect to the horizontal portion 611. Further, the other of the fourth branch electrodes 601d connected to the vertical portion 612 in the fourth domain D may extend in a diagonal direction with respect to the vertical portion 612.

The aforementioned stem electrode 613 may further include a first connecting portion 614a and a second connecting portion 614b. The first connecting portion 614a is connected to one end of the horizontal portion 611, and the second connecting portion 614b is connected to another end of the horizontal portion 611. The first connecting portion 614a and the second connecting portion 614b may be aligned parallel to the vertical portion 612. The first connecting portion 614a and the second connecting portion 614b may be unitary with the stem electrode 613.

End portions of at least two of the first branch electrodes 601a in the first domain A and end portions of at least two of the fourth branch electrodes 601d in the fourth domain D may be connected to one another by the second connecting portion 614b. Similarly thereto, end portions of at least two of the second branch electrodes 601b in the second domain B and end portions of at least two of the third branch electrodes 601c in the third domain C may be connected to one another by the first connecting portion 614a.

In addition, although not illustrated, end portions of at least two of the first branch electrodes 601a in the first domain A and end portions of at least two of the second branch electrodes 601b in the second domain B may be connected to another connecting portion. Further, end portions of at least two of the third branch electrodes 601c in the third domain C and end portions of at least two of the fourth branch electrodes 601d in the fourth domain D may be connected to another connecting portion.

The first sub-pixel electrode PE1 and the first storage electrode 751 may overlap each other. For example, an edge portion of the first sub-pixel electrode PE1 may be disposed above the first storage electrode 751.

A connecting portion between the first switching element TFT1 and the first sub-pixel electrode PE1 may be disposed between the gate line GL and the first sub-pixel electrode PE1. In other words, the first contact hole CH1 may be disposed between the gate line GL and the first sub-pixel electrode PE1.

The second sub-pixel electrode PE2, as illustrated in FIGS. 1 and 3, is disposed in the second sub-pixel area P2. In such an exemplary embodiment, the second sub-pixel electrode PE2 is disposed above the capping layer 391. The second sub-pixel electrode PE2 is connected to the second source electrode SE2 through the second contact hole CH2. The second sub-pixel electrode PE2 may include or be formed of the same material as that included in the first sub-pixel electrode PE1. That is, the second sub-pixel electrode PE2 and the first sub-pixel electrode PE1 may be simultaneously provided in the same process.

The second sub-pixel electrode PE2 may have substantially the same configuration as that of the first sub-pixel electrode PE1. For example, the second sub-pixel electrode PE2 includes a stem electrode that divides the second sub-pixel area P2 into a plurality of domains and branch electrodes extending from the stem electrode into corresponding ones of the domains. In addition, the second sub-pixel electrode PE2 may further include a first connecting portion and a second connecting portion. Since the stem electrode, the branch electrode, the first connecting portion, and the second connecting portion included in the second sub-pixel electrode PE2 are the same as those included in the first sub-pixel electrode PE1, descriptions pertaining thereto will make reference to FIG. 5 and the related descriptions.

The second sub-pixel electrode PE2 may have a planar area greater than or equal to that of the first sub-pixel electrode PE1. In an exemplary embodiment, the planar area of the second sub-pixel electrode PE2 may be from one time to two times the planar area of the first sub-pixel electrode PE1.

The second sub-pixel electrode PE2 and the second storage electrode 752 may overlap each other. For example, an edge portion of the second sub-pixel electrode PE2 may be disposed above the second storage electrode 752.

A connecting portion between the second switching element TFT2 and the second sub-pixel electrode PE2 may be disposed between the gate line GL and the second sub-pixel electrode PE2. In other words, the second contact hole CH2 may be defined between the gate line GL and the second sub-pixel electrode PE2.

A connecting portion between the third switching element TFT3 and the storage line 750 may be disposed between the gate line GL and the first sub-pixel electrode PE1. In other words, the third contact hole CH3 may be defined between the gate line GL and the first sub-pixel electrode PE1.

The light blocking layer 376, as illustrated in FIGS. 2, 3, and 4, is disposed above the second substrate 302. The light blocking layer 376 is disposed above a portion of the second substrate 302, except the first sub-pixel area P1 and the second sub-pixel area P2. In an alternative exemplary embodiment, the light blocking layer 376 may be disposed above the first substrate 301. The light blocking layer 376 may be referred to as a black matrix.

The overcoat layer 722 is disposed above the light blocking layer 376. In such an exemplary embodiment, the overcoat layer 722 may be disposed over an entire surface of the second substrate 302 including the light blocking layer 376. The overcoat layer 722 serves to significantly reduce (i.e., minimize) a height difference among elements between the overcoat layer 722 and the second substrate 302, for example, among elements of the second substrate 302 such as the aforementioned light blocking layer 376. The overcoat layer 722 may be omitted.

The common electrode 330 is disposed above the overcoat layer 722. In such an exemplary embodiment, the common electrode 330 may be disposed over the entire surface of the second substrate 302 including the overcoat layer 722. However, in an alternative exemplary embodiment, the common electrode 330 may be disposed above portions of the overcoat layer 722 to correspond to the first sub-pixel area P1 and the second sub-pixel area P2. The common voltage Vcom is applied to the common electrode 330.

Although not illustrated, an exemplary embodiment of the LCD device may further include a first polarizer and a second polarizer. In the case that a surface of the first substrate 301 and a surface of the second substrate 302 that face each other are defined as upper surfaces of the corresponding substrates, respectively, and surfaces opposite to the upper surfaces are defined as lower surfaces of the corresponding substrates, respectively, the aforementioned first polarizer is disposed above the lower surface of the first substrate 301, and the second polarizer is disposed above the lower surface of the second substrate 302.

A transmission axis of the first polarizer is perpendicular to a transmission axis of the second polarizer, and one of the transmission axes thereof is oriented parallel to the gate line GL. In an alternative exemplary embodiment, the LCD device may only include one of the first polarizer and the second polarizer.

In an exemplary embodiment, although not illustrated, the LCD device may further include a shielding electrode. The shielding electrode may be disposed above the capping layer 391 to overlap the data line DL. For example, the shielding electrode may have the same shape as that of the data line DL and may be disposed along the data line DL. The shielding electrode may include or be formed of a material the same as that included in the first sub-pixel electrode PE1. The common voltage Vcom may be applied to the shielding electrode. The shielding electrode is configured to prevent formation of an electric field between the data line DL and the sub-pixel electrode, for example, the first and second sub-pixel electrodes PE1 and PE2. In such an exemplary embodiment, the shielding electrode and the common electrode 330 have an equivalent electric potential such that light transmitted through the liquid crystal layer between the shielding electrode and the common electrode 330 is shielded by the second polarizer. Accordingly, light leakage may be significantly reduced or prevented at a portion corresponding to the data line DL.

The first substrate 301 and the second substrate 302 are insulating substrates that include or are formed of glass or plastic.

The liquid crystal layer between the first substrate 301 and the second substrate 302 include liquid crystal molecules. The liquid crystal molecules may have a negative dielectric constant and may be homeotropic liquid crystal molecules.

In an exemplary embodiment, the first storage electrode 751 in one pixel (hereinafter, a first pixel) may be connected to the second storage electrode 752 in another pixel (hereinafter, a second pixel) that is adjacent to the first pixel, which will be described further in detail with reference to FIG. 6.

Figure 6:
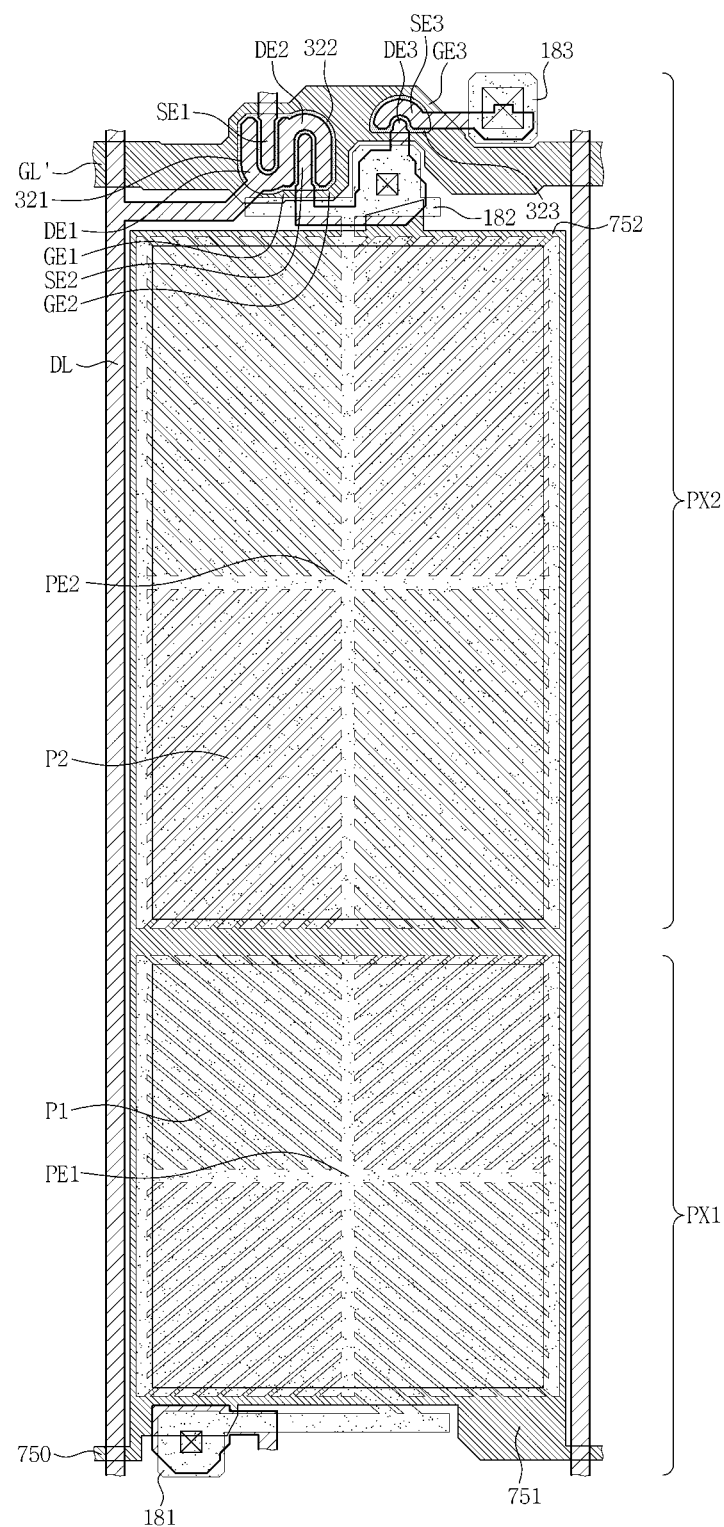
FIG. 6 is a view illustrating two adjacent pixels having a structure described in FIG. 1.

FIG. 6 is a view illustrating two adjacent pixels having a structure described in FIG. 1. A portion of the first pixel and a portion of the second pixel are illustrated in FIG. 6. In an exemplary embodiment, the first pixel and the second pixel have the same structure as that of the pixel illustrated in FIG. 1.

As illustrated in FIG. 6, the first storage electrode 751 in the first pixel PX1 may be connected to the second storage electrode 752 in the second pixel PX2. For example, the first storage electrode 751 in the first pixel PX1 and the second storage electrode 752 in the second pixel PX2 that are adjacent to each other between two adjacent ones of the gate lines GL and GL' may be connected to each other. In such an exemplary embodiment, the first storage electrode 751 of the first pixel PX1 and the second storage electrode 752 of the second pixel PX2 may be unitary.

FIGS. 7A, 7B, 7C, 7D, 7E, 7F, 7G, 7H, 7I, 7J, 7K, 7L, 7M, 7N, 7O, and 7P are cross-sectional views illustrating a process of manufacturing an LCD device according to an exemplary embodiment. FIGS. 7A, 7B, 7C, 7D, 7E, 7F, 7G, 7H, 7I, 7J, 7K, 7L, 7M, 7N, 7O, and 7P illustrate cross-sectional views taken along line I-I' of FIG. 1.

First, although not illustrated, a gate metal layer is deposited over the entire surface of the first substrate 301. The gate metal layer may be deposited by a physical vapor deposition ("PVD") method such as sputtering.

Figure 7A:
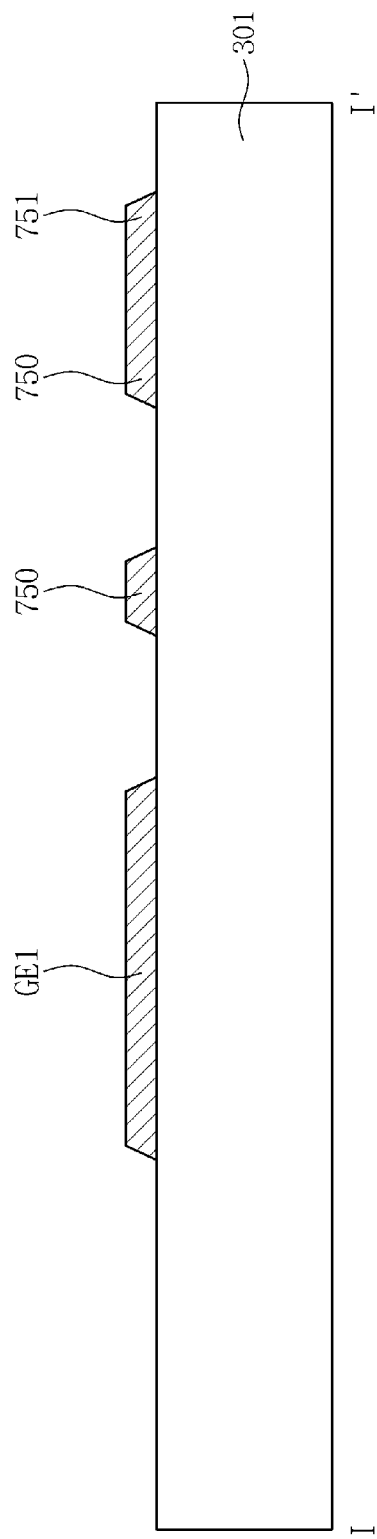
FIGS. 7A, 7B, 7C, 7D, 7E, 7F, 7G, 7H, 7I, 7J, 7K, 7L, 7M, 7N, 7O, and 7P are cross-sectional views illustrating a process of manufacturing an LCD device according to an exemplary embodiment.

Subsequently, the aforementioned gate metal layer is patterned through a photolithography process such that the first gate electrode GE1, the storage line 750, and the first storage electrode 751 are formed above the first substrate 301 as illustrated in FIG. 7A. In an exemplary embodiment, although not illustrated, the gate line GL, the second gate electrode GE2, the third gate electrode GE3, and the second storage electrode 752 are also formed above the first substrate 301 when the gate metal layer is patterned.

The gate metal layer may be removed by a wet-etching method using an etching solution.

The gate metal layer may include or be formed of a material included in the aforementioned gate line GL.

Figure 7B:
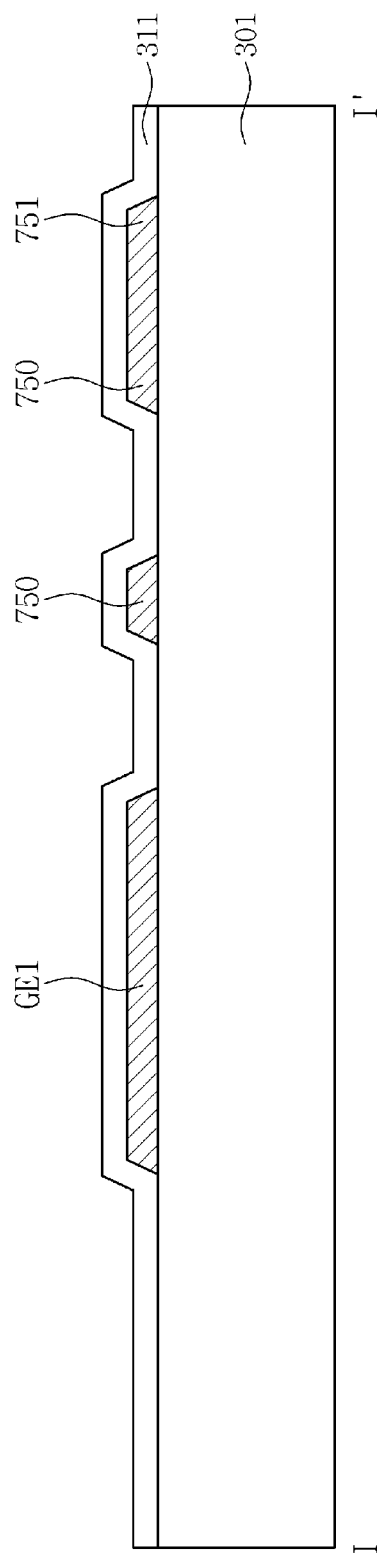

Subsequently, as illustrated in FIG. 7B, the gate insulating layer 311 is deposited over the entire surface of the first substrate 301 including the gate line GL, the first gate electrode GE1, the storage line 750, the first storage electrode 751, the second gate electrode GE2, the third gate electrode GE3, and the second storage electrode 752. The gate insulating layer 311 may be deposited by a chemical vapor deposition ("CVD") method.

The gate insulating layer 311 may include or be formed of a material included in the aforementioned gate insulating layer 311.

Figure 7C:
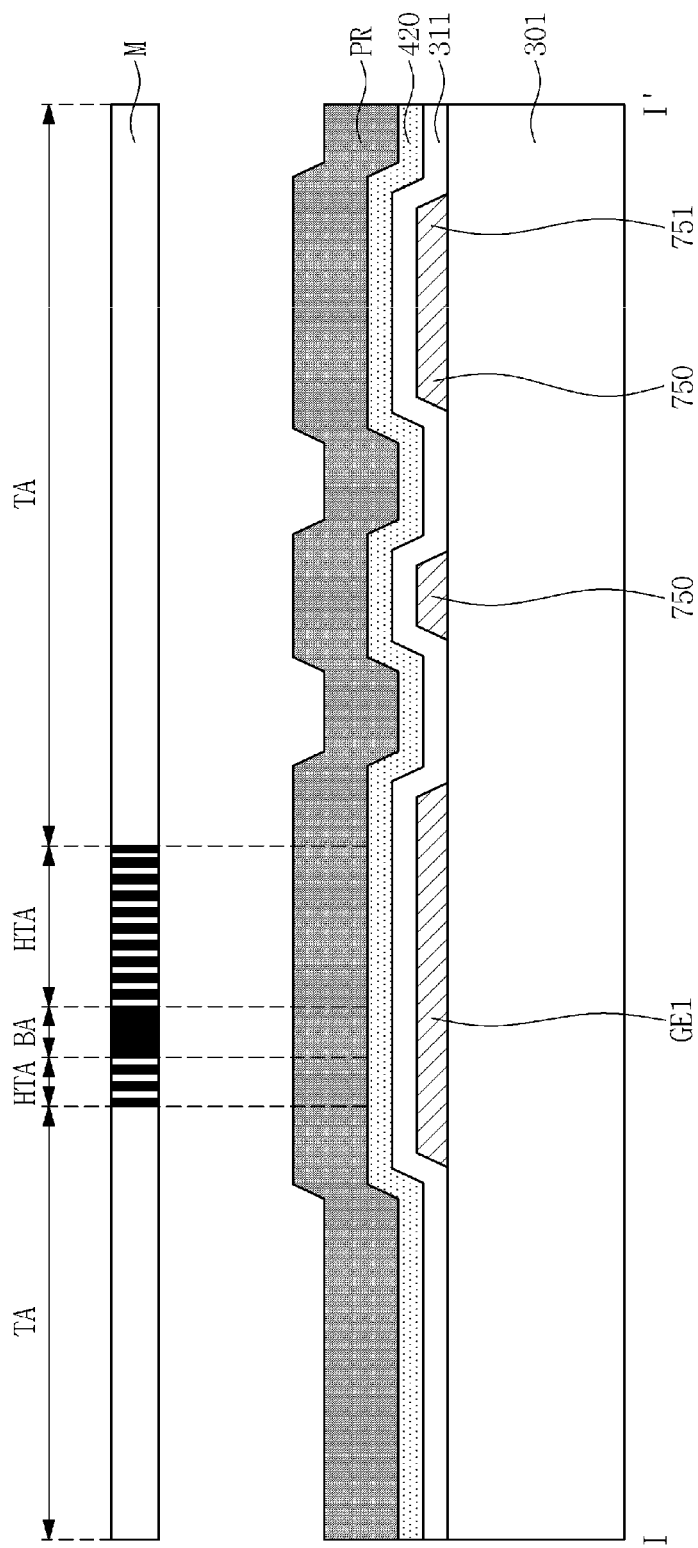

Subsequently, as illustrated in FIG. 7C, a semiconductor material 420 is formed above the gate insulating layer 311. The semiconductor material 420 is deposited over the entire surface of the first substrate 301 including the gate insulating layer 311. The semiconductor material 420 may be deposited by a chemical vapor deposition (CVD) method. The semiconductor material 420 may include or be formed of a material included in the first semiconductor layer 321.

Subsequently, a photoresist PR is formed above the semiconductor material 420. The photoresist PR is coated over the entire surface of the first substrate 301 including the semiconductor material 420.

Subsequently, a mask M is disposed above the photoresist PR. The mask M has a transmissive area TA through which light is transmitted, a blocking area BA through which light is blocked, and a half-transmissive area HTA through which light is partially transmitted. The half-transmissive area HTA may include a plurality of slits or a semi-transparent layer. In such an exemplary embodiment, a light transmittance of the half-transmissive area HTA is lower than a light transmittance of the transmissive area TA. For example, the light transmittance of the half-transmissive area HTA may be about half the light transmittance of the transmissive area TA.

Figure 7D:
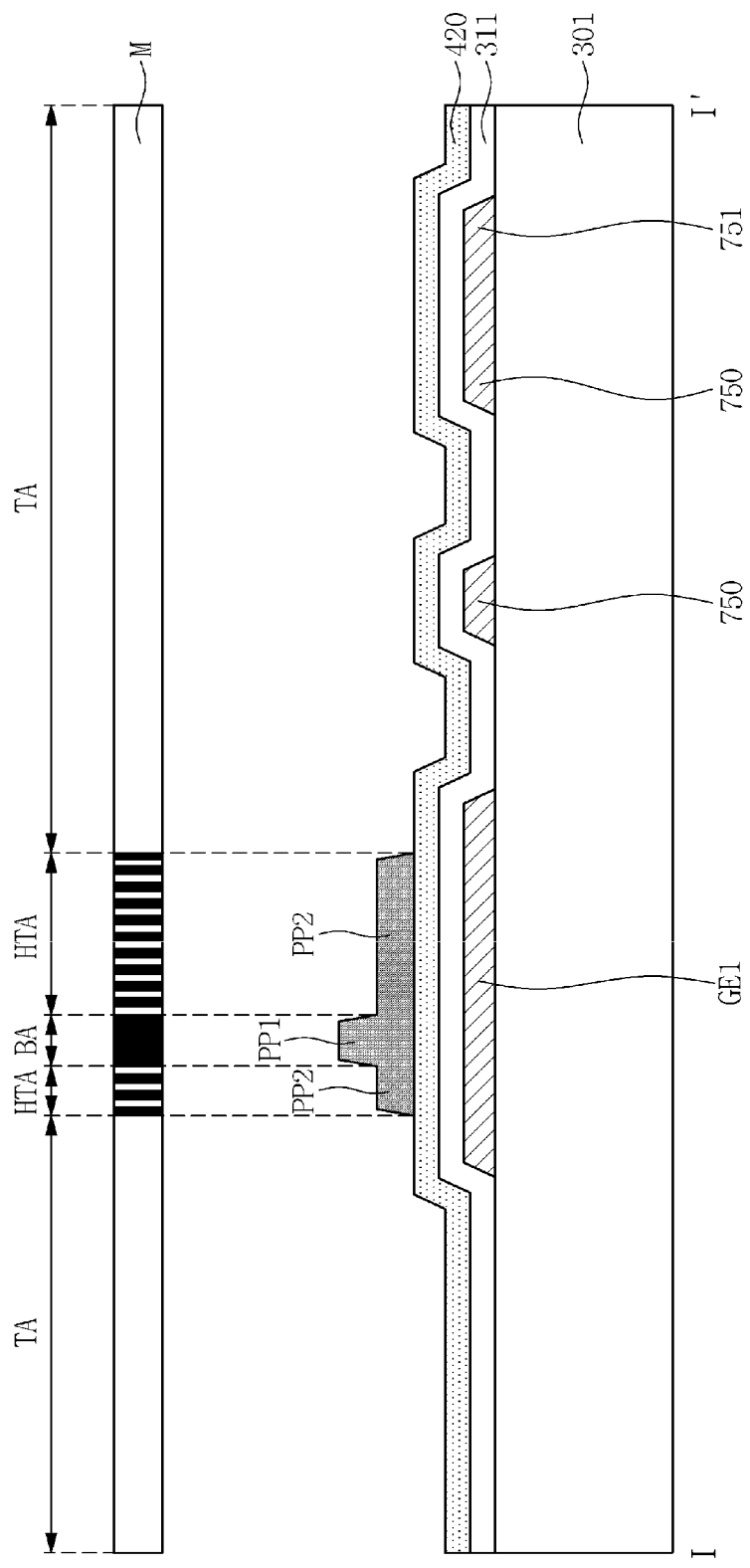

Subsequently, light, e.g., ultraviolet light, is irradiated in a selective manner to the photoresist PR through the mask M such that the photoresist PR is exposed. In the case that the photoresist PR that is exposed is developed, a first photoresist pattern PP1 and a second photoresist pattern PP2, which have difference thicknesses, are formed above the semiconductor material 420 as illustrated in FIG. 7D. The second photoresist pattern PP2 has a smaller thickness than that of the first photoresist pattern PP1. For example, the thickness of the second photoresist pattern PP2 may be about half the thickness of the first photoresist pattern PP1.

The first photoresist pattern PP1 is disposed above a portion of the semiconductor material 420 corresponding to the blocking area BA of the pattern mask M, and the second photoresist pattern PP2 is disposed above a portion of the semiconductor material 420 corresponding to the half-transmissive area HTA of the mask M. In other words, the first photoresist pattern PP1 and the second photoresist pattern PP2 are disposed to correspond to an area of the first semiconductor layer 321 to be formed later. In such an exemplary embodiment, the first photoresist pattern PP1 is disposed to correspond to the channel area of the first switching element TFT1 of the first semiconductor layer 321.

A portion of the photoresist PR corresponding to the transmissive area TA of the mask M is completely removed.

Although not illustrated, through a developing process of the aforementioned photoresist PR, another first and second photoresist patterns and still another first and second photoresist patterns are formed above the semiconductor material 420. Each of the another first photoresist pattern and the still another first photoresist pattern have substantially the same thickness as that of the aforementioned first photoresist pattern PP1, and each of the another second photoresist pattern and the still another second photoresist pattern have substantially the same thickness as that of the second photoresist pattern PP2. The another first and second photoresist patterns are disposed to correspond to an area of the second semiconductor layer 322 to be formed later, and the still another first and second photoresist patterns are disposed to correspond to an area of the third semiconductor layer 323 to be formed later. In such an exemplary embodiment, the another first photoresist pattern is disposed to correspond to the channel area of the second switching element TFT2 of the second semiconductor layer 322, and the still another second photoresist pattern is disposed to correspond to the channel area of the third switching element TFT3 of the third semiconductor layer 323.

Figure 7E:
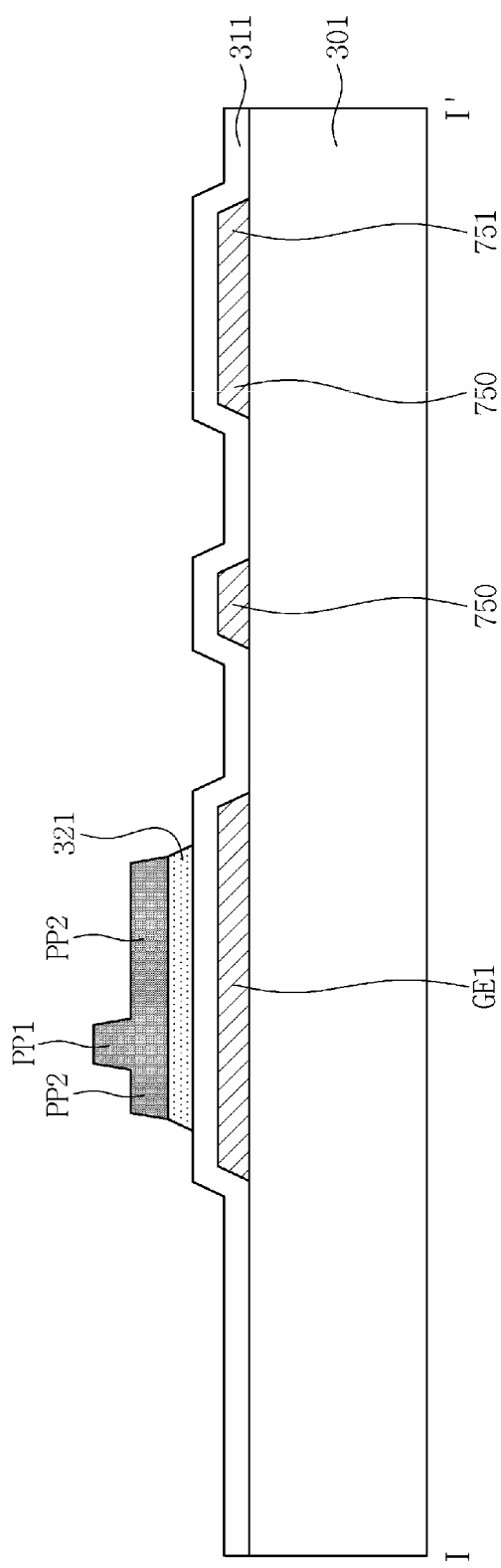

Subsequently, in the state that the first and second photoresist patterns PP1 and PP2 are formed, the semiconductor material 420 is etched using the first and second photoresist patterns PP1 and PP2 as a mask. In such an exemplary embodiment, as illustrated in FIG. 7E, the first semiconductor layer 321 which overlaps the first gate electrode GE1 is formed above the gate insulating layer 311. Although not illustrated, in the aforementioned etching process of the semiconductor material 420, the second semiconductor layer 322 and the third semiconductor layer 323 are also formed above the gate insulating layer 311.

Figure 7F:
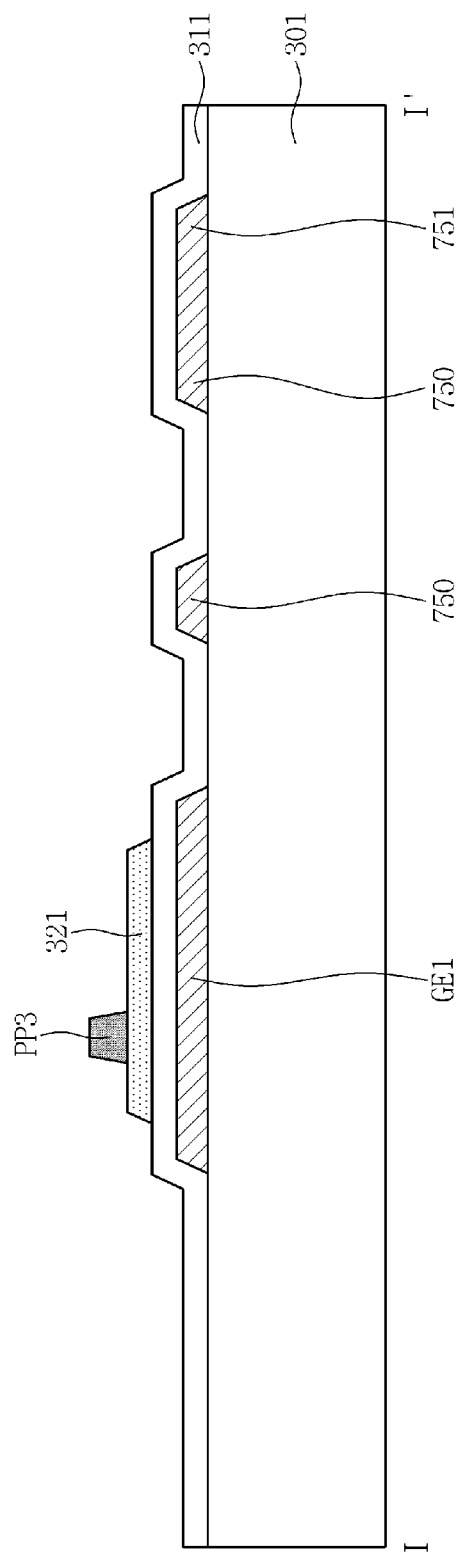
Figure 7G:
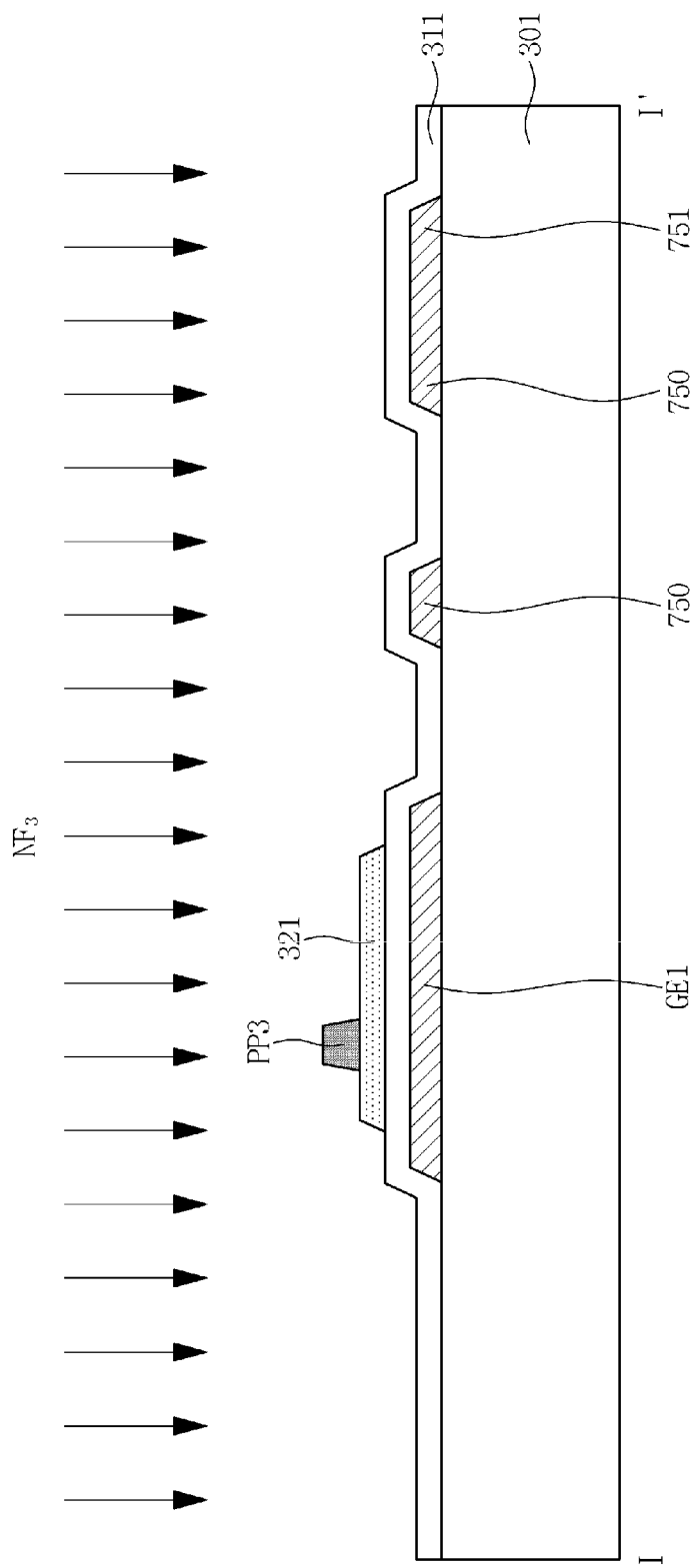

Subsequently, as illustrated in FIG. 7F, an ashing process is performed. In the ashing process, the thickness of the first photoresist pattern PP1 and the thickness of the second photoresist pattern PP2 are reduced by the same level. In such an exemplary embodiment, the ashing process is performed until the second photoresist pattern PP2, having a relatively smaller thickness, is completely removed. That is, the ashing process ends when the second photoresist pattern PP2 is completely removed.

As the second photoresist pattern PP2 is removed, the non-channel area of the first semiconductor layer 321 therebelow is exposed. In an exemplary embodiment, as a portion of the first photoresist PP1 is removed in the ashing process, the thickness of the first photoresist pattern PP1 is reduced. Hereinafter, the first photoresist pattern PP1 after ashing is defined as a third photoresist pattern PP3. The third photoresist pattern PP3 is disposed to correspond to the channel area of the first semiconductor layer 321. Although not illustrated, through the ashing process, another third photoresist patterns are disposed to correspond to the channel area of the second semiconductor layer 322 and the channel area of the third semiconductor layer 323.

Subsequently, a hydrophobization process is performed on the third photoresist pattern PP3. To this end, as in an example illustrated in FIG. 7G, the third photoresist pattern PP3 may be exposed to $NF_3$. For example, $NF_3$ may be applied over the entire surface of the first substrate 301 including the third photoresist pattern PP3. In such an exemplary embodiment, $NF_3$ may be provided as gas or plasma. The third photoresist pattern PP3 to which $NF_3$ is applied is transformed into a fluorinated resist. Accordingly, a surface of the third photoresist pattern PP3 is hydrophobizated.

In an exemplary embodiment, $NF_3$ that is applied in the aforementioned hydrophobization process of the third photoresist pattern PP3 is also applied to the gate insulating layer 311, and thus the gate insulating layer 311 may include fluorine (F). In such an exemplary embodiment, as being more adjacent to the first substrate 301, the gate insulating layer 311 includes fluorine (F) at lower concentration. That is, the gate insulating layer 311 has a fluorine (F) concentration that varies in the vertical direction. For example, a portion of the gate insulating layer 311 relatively adjacent to the first substrate 301 has a relatively low concentration of fluorine (F), and another portion of the gate insulating layer 311 relatively distanced from the first substrate 301 which is exposed to the $NF_3$ has a relatively high concentration of fluorine (F). For example, the portion of the gate insulating layer 311 relatively adjacent to the first substrate 301 may include fluorine atoms at a concentration of about $10^{18}$ atom/cm$^3$, and the another portion of the gate insulating layer 311 relatively distanced from the first substrate 301 may include fluorine atoms at a concentration higher than about $10^{18}$ atom/cm$^3$.

Figure 7H:
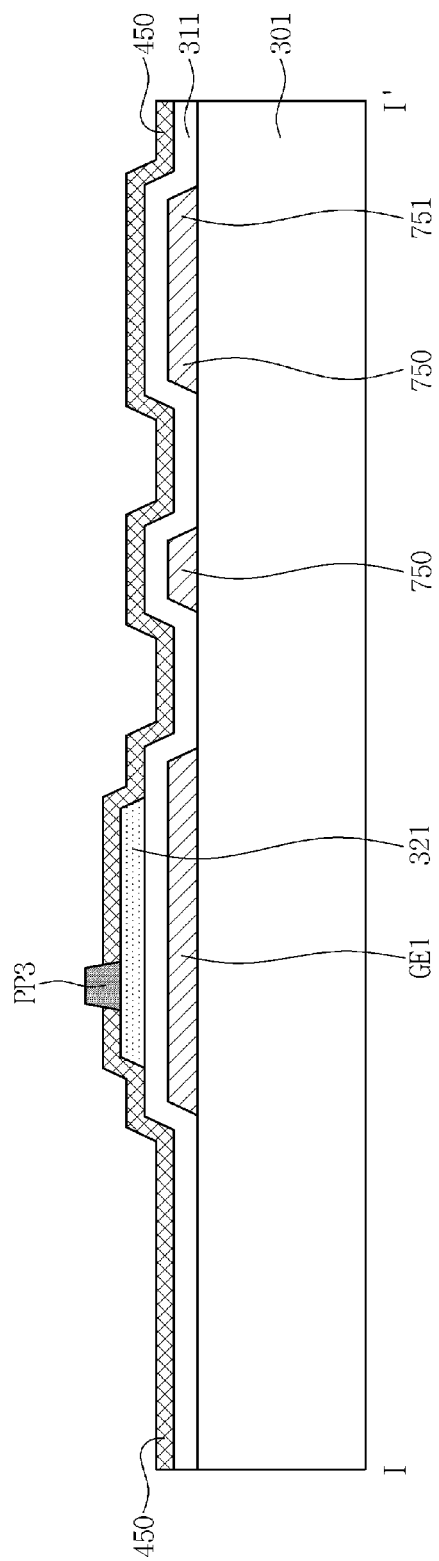

Subsequently, as illustrated in FIG. 7H, an impurity semiconductor material 450 is deposited over the entire surface of the first substrate 301 excluding the third photoresist pattern PP3 that is hydrophobizated. The impurity semiconductor material 450 may include or be formed of a material included in the aforementioned first ohmic contact layer 321a. In such an exemplary embodiment, the impurity semiconductor material 450, as illustrated in FIG. 7H, is not deposited above the third photoresist pattern PP3, which is because the surface of the third photoresist pattern PP3 has hydrophobic characteristics. Accordingly, the impurity semiconductor material 450 is deposited in a selective manner above the first substrate 301, e.g., above the gate insulating layer 311 and in the non-channel area of the first semiconductor layer 321, except an area corresponding to the third photoresist pattern PP3.

As such, the impurity semiconductor material 450 is not be formed in the channel area of the first semiconductor layer 321 due to the third photoresist pattern PP3 that is hydrophobizated. Although not illustrated, the third photoresist pattern PP3 that is hydrophobizated is also disposed in the channel area of the second semiconductor layer 322 and the channel area of the third semiconductor layer 323, and thus the impurity semiconductor material 450 is not formed in the channel area of the second semiconductor layer 322 and the channel area of the third semiconductor layer 323. Accordingly, in the deposition process of the impurity semiconductor material 450, impurities (e.g., phosphorus (P)) of the impurity semiconductor material 450 may be prevented from diffusing into the channel areas of respective ones of the first, second, and third semiconductor layers 321, 322, and 323.

Figure 7I:
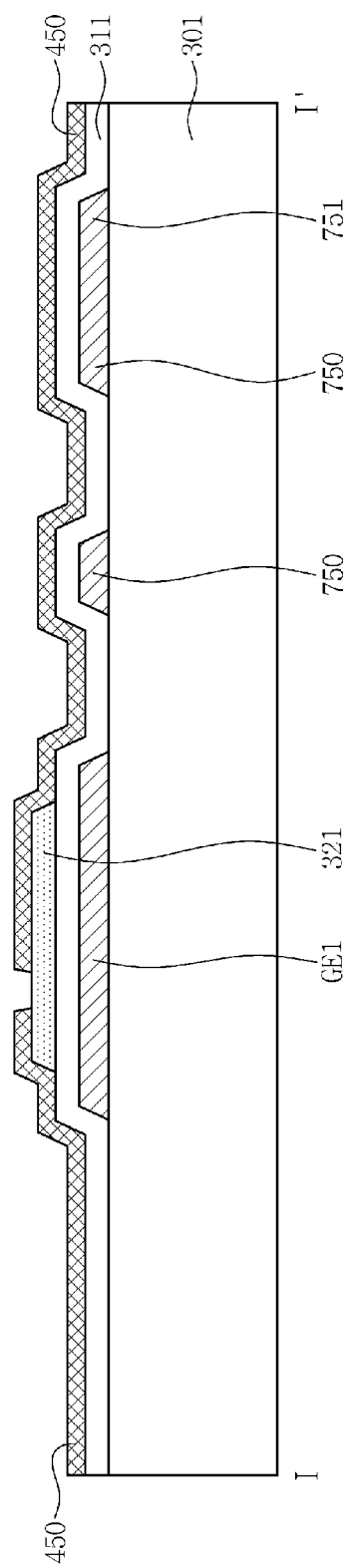

Subsequently, as illustrated in FIG. 7I, the third photoresist pattern PP3 is removed. As the third photoresist pattern PP3 is removed, the channel area of the first semiconductor layer 321 therebelow is exposed. The third photoresist pattern PP3 may be removed by a strip solution. The strip solution may include ethylene carbonate. Although not illustrated, the third photoresist pattern disposed in the channel area of the second semiconductor layer 322 and the third photoresist pattern disposed in the channel area of the third semiconductor layer 323 are also removed by the aforementioned strip solution.

Figure 7J:
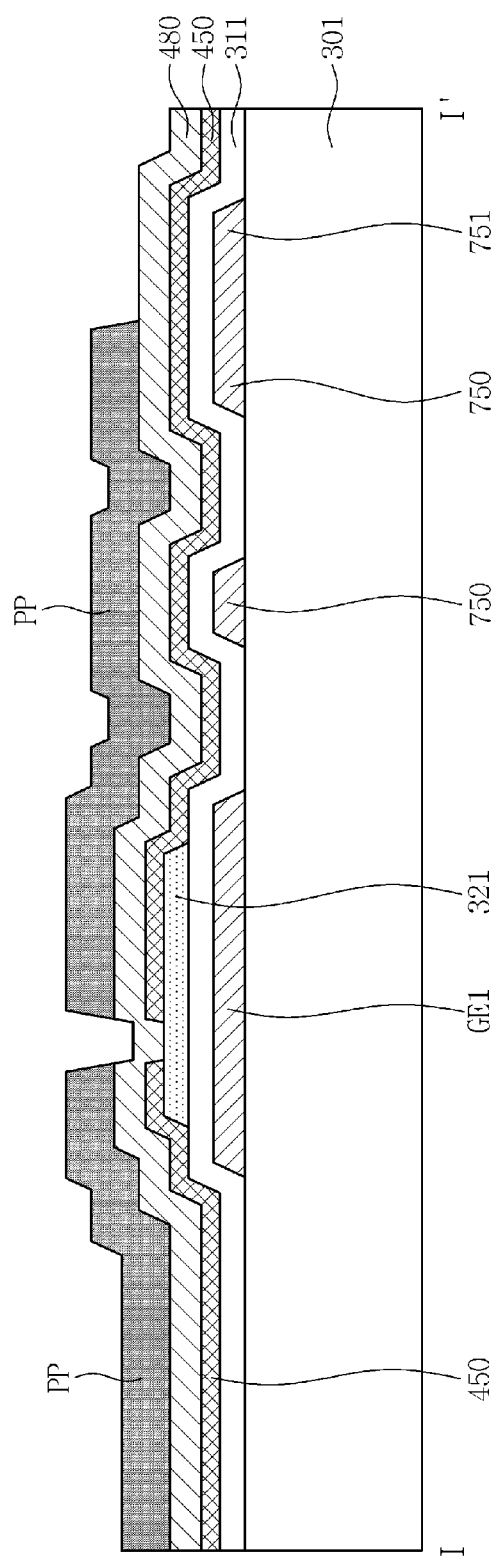

Subsequently, as illustrated in FIG. 7J, a source metal layer 480 is formed above the impurity semiconductor material 450, the first semiconductor layer 321, the second semiconductor layer 322, and the third semiconductor layer 323. In such an exemplary embodiment, the source metal layer 480 is deposited over the entire surface of the first substrate 301 including the impurity semiconductor material 450, the first semiconductor layer 321, the second semiconductor layer 322, and the third semiconductor layer 323.

Subsequently, although not illustrated, a photoresist is coated above the source metal layer 480. The photoresist is coated over the entire surface of the first substrate 301 including the source metal layer 480.

Subsequently, when the photoresist is exposed and developed, the photoresist pattern PP is formed above the source metal layer 480 as illustrated in FIG. 7J.

Subsequently, in the state that the photoresist pattern PP is exist on the source metal layer 480, the source metal layer 480 and the impurity semiconductor material 450 are patterned through an etching process using the photoresist pattern PP as a mask. In such an exemplary embodiment, both of the source metal layer 480 and the impurity semiconductor material 450 are removed by a wet etching method, which is attributed to the impurity semiconductor material 450 including the impurities at high concentration. For example, the impurity semiconductor material 450 may include impurities at a concentration of about $2*10^{21}$ atom/cm$^3$ or higher, and the impurity semiconductor material 450 including the impurities at such a high concentration may have characteristics substantially similar to metal and thus may be removed in the wet etching method. As such, as the impurity semiconductor material 450 may be removed in the wet etching method, the channel areas of respective ones of the first, second, and third semiconductor layers 321, 322, and 323 may not be damaged in the wet etching process. Accordingly, upper surfaces of respective ones of the first, second, and third semiconductor layers 321, 322, and 323 may be maintained flat.

Figure 7K:
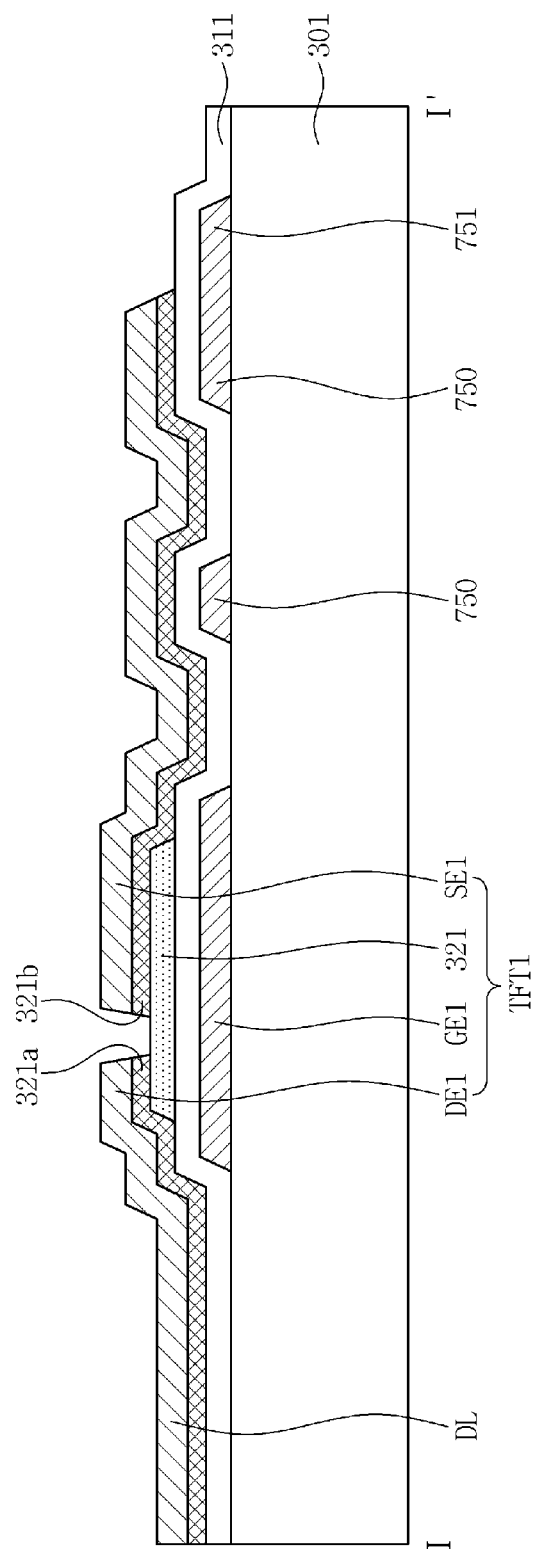

Through such a patterning process, as illustrated in FIG. 7K, the first ohmic contact layer 321a, the second ohmic contact layer 321b, the first drain electrode DE1, and the first source electrode SE1 are formed. Although not illustrated, the third ohmic contact layer 322a, the fourth ohmic contact layer 322b, the fifth ohmic contact layer 323a, the sixth ohmic contact layer 323b, the second drain electrode DE2, the second source electrode SE2, the third drain electrode DE3, and the third source electrode SE3 are also formed through the patterning process.

Figure 7L:
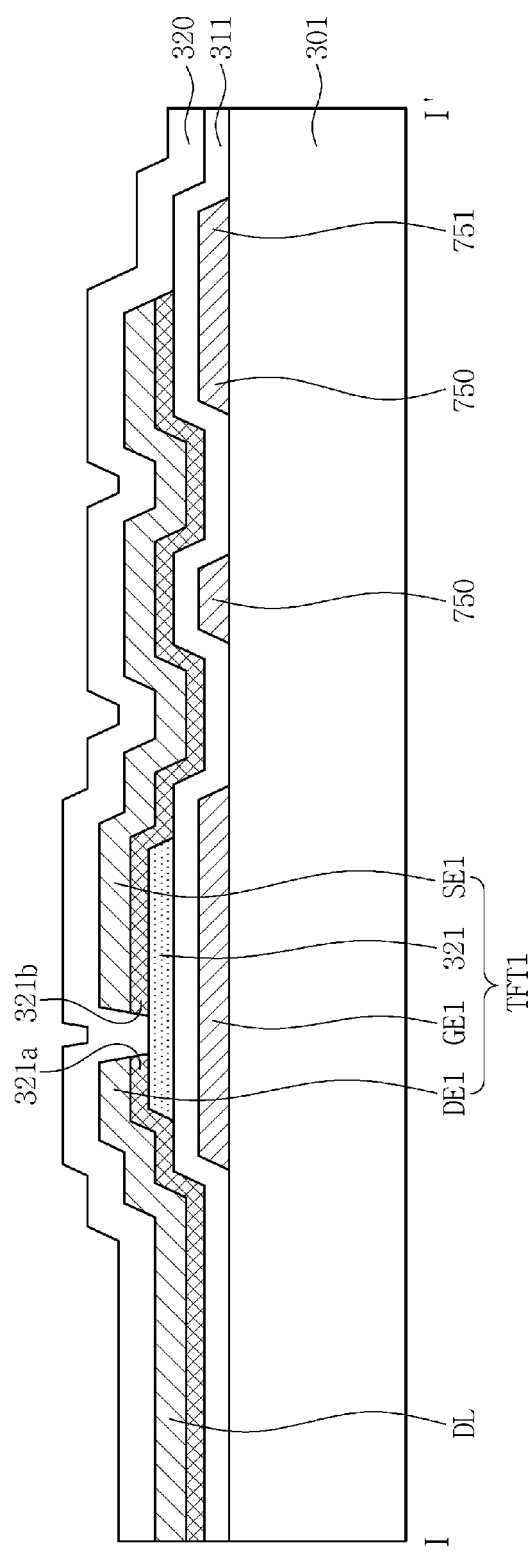

Subsequently, as illustrated in FIG. 7L, the passivation layer 320 is deposited over the entire surface of the first substrate 301 including the first drain electrode DE1, the first source electrode SE1, the second drain electrode DE2, the second source electrode SE2, the third drain electrode DE3, and the third source electrode SE3.

The passivation layer 320 may include a material included in the aforementioned passivation layer 320.

Subsequently, although not illustrated, a photosensitive organic material is formed over the entire surface of the first substrate 301 including the passivation layer 320.

Figure 7M:
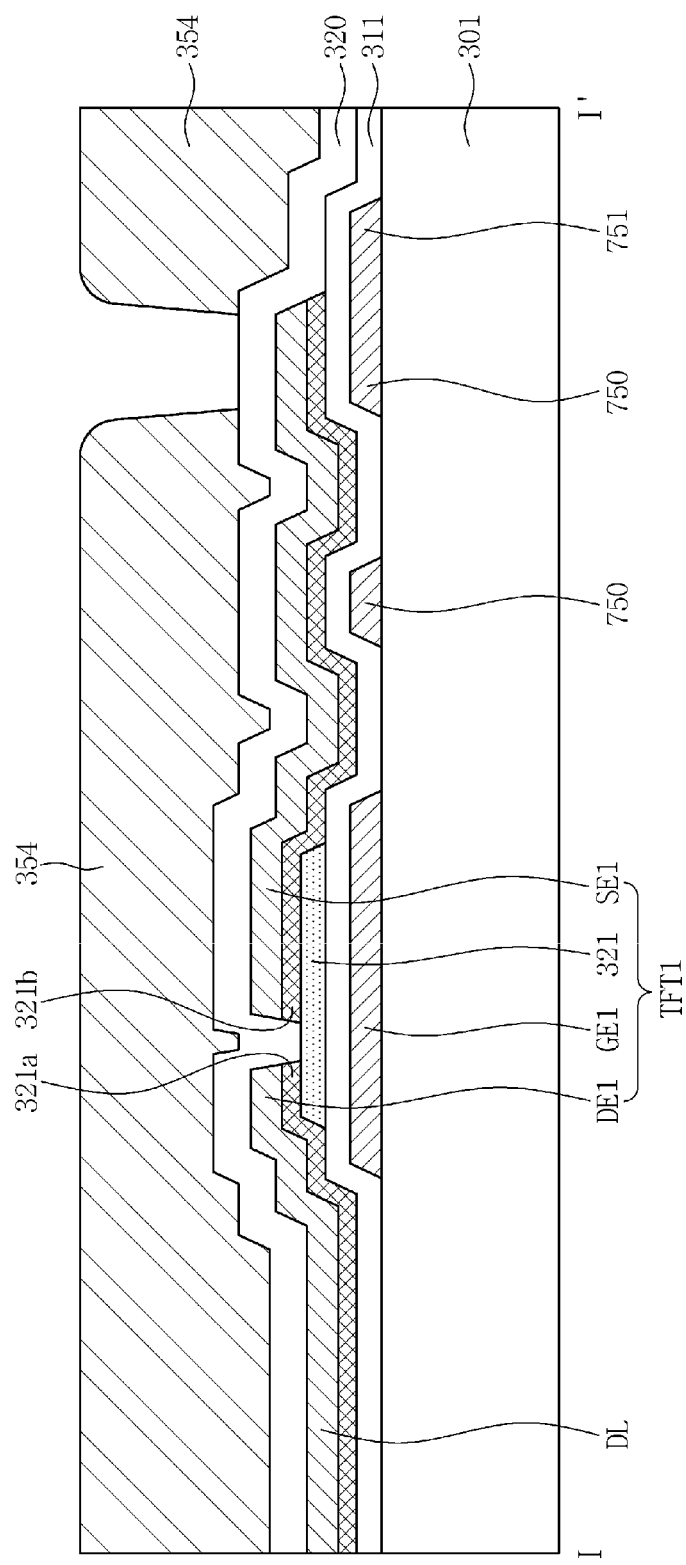

Subsequently, as the photosensitive organic material is patterned through a photolithography process, the color filter 354 is formed in the first sub-pixel area P1 and the second sub-pixel area P2 as illustrated in FIG. 7M.

Figure 7N:
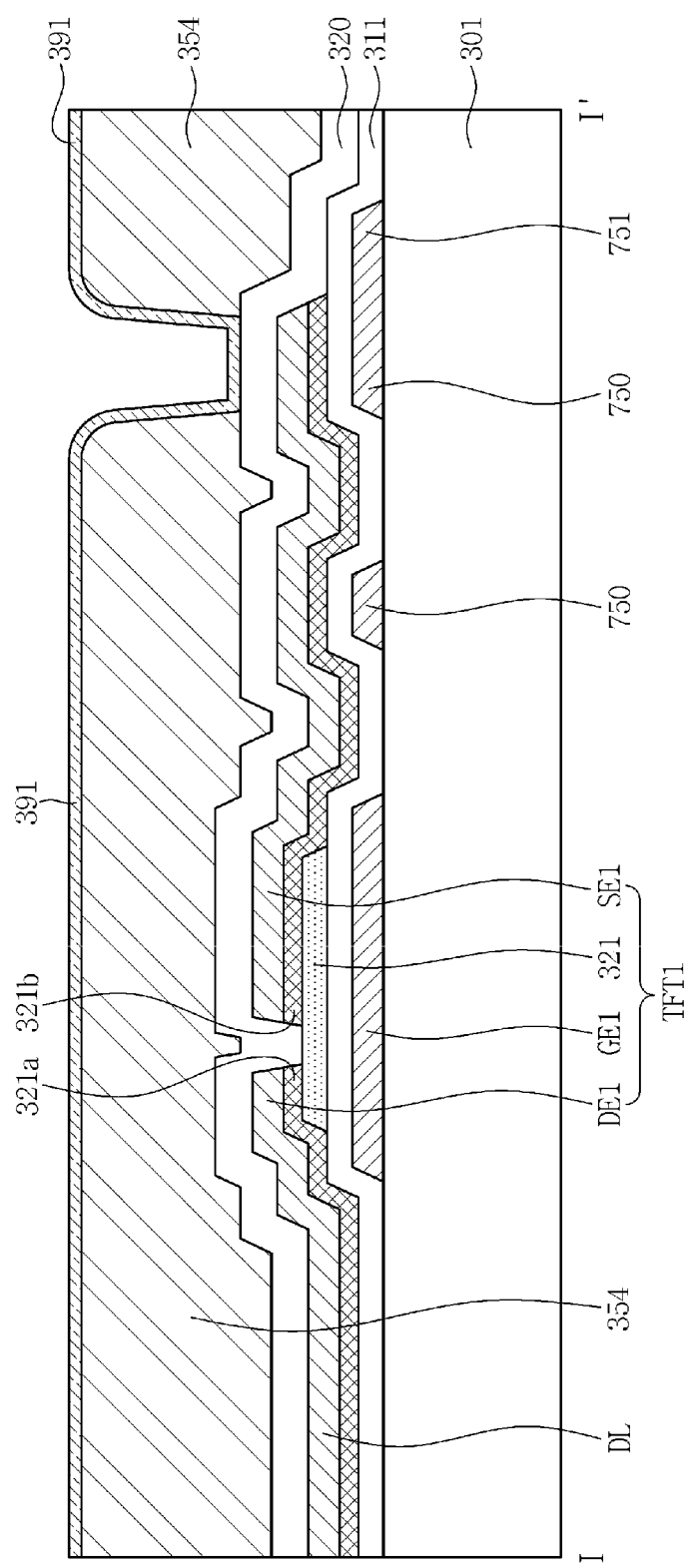

Subsequently, as illustrated in FIG. 7N, the capping layer 391 is deposited over the entire surface of the first substrate 301 including the color filter 354.

The capping layer 391 may include a material included in the aforementioned capping layer 391.

Figure 7O:
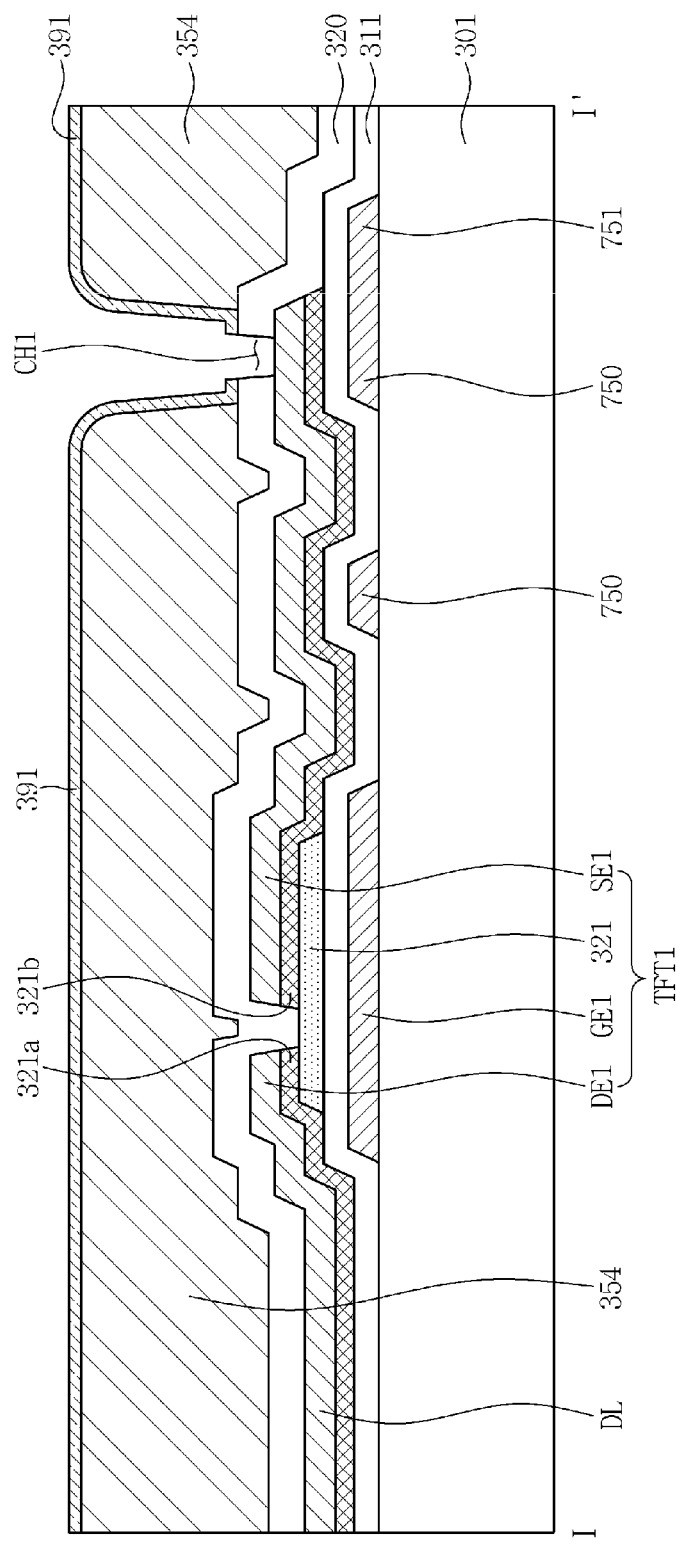

Subsequently, the capping layer 391 and the passivation layer 320 are removed in a selective manner through a photolithography process such that the first contact hole CH1 which exposes a top surface of the first source electrode SE1 is defined as illustrated in FIG. 7O. In an exemplary embodiment, although not illustrated, through the aforementioned removal of the capping layer 391 and the passivation layer 320 in a selective manner, the second contact hole CH2 which exposes a top surface of the second source electrode SE2 is also defined. In addition, although not illustrated, the gate insulating layer 311, in addition to the capping layer 391 and the passivation layer 320, is further removed in a selective manner such that third contact hole CH3 which exposes a top surface and a side surface of the third source electrode SE3, a side surface of the sixth ohmic contact layer 323b, and the storage line 750 is defined.

Subsequently, although not illustrated, a transparent metal layer is deposited over the entire surface of the first substrate 301 including the capping layer 391, the first source electrode SE1, the second source electrode SE2, the side surface of the third source electrode SE3, the side surface of the sixth ohmic contact layer 323b, and the storage line 750.

The transparent metal layer may include a material included in the aforementioned first sub-pixel electrode PE1.

Figure 7P:
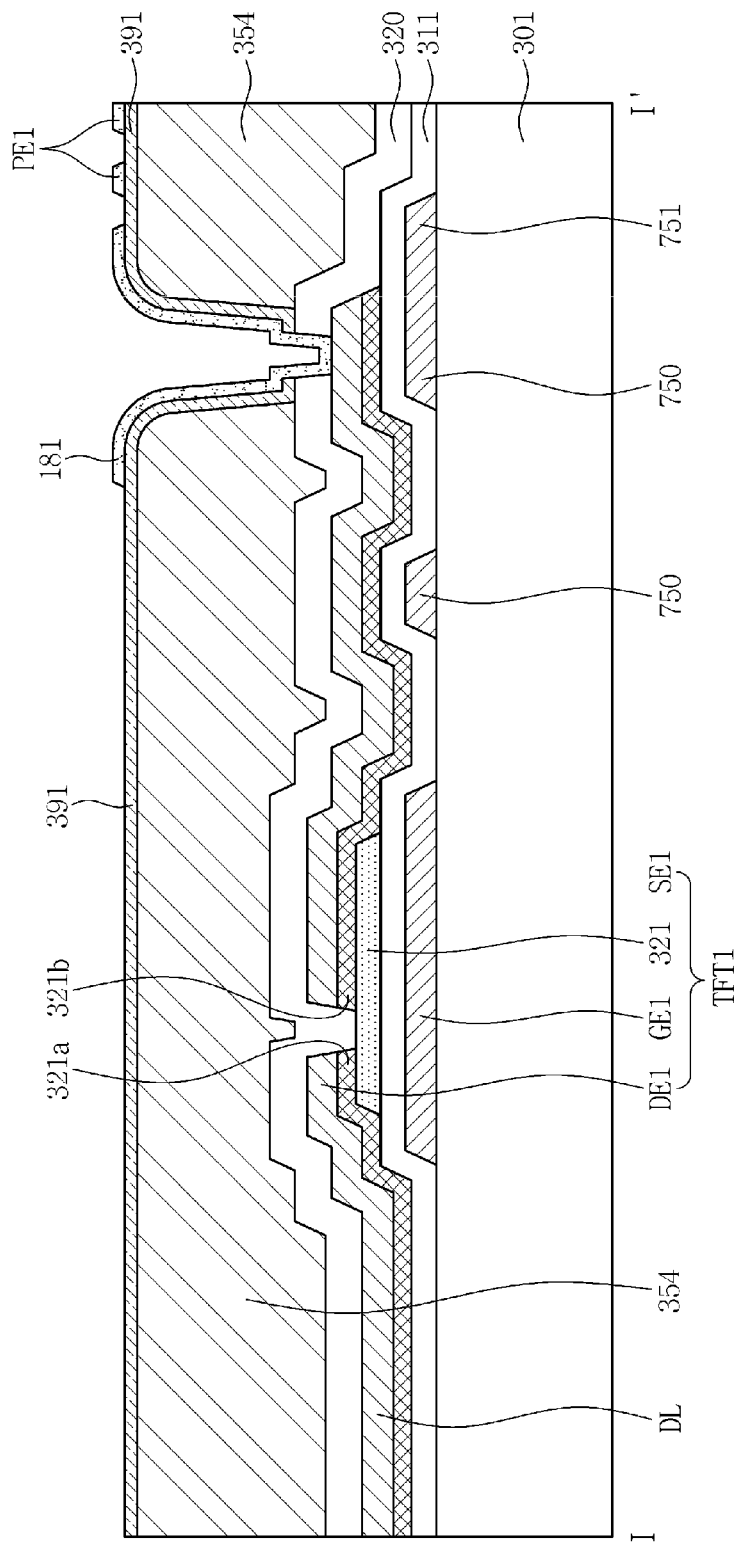

Subsequently, as the transparent metal layer is patterned through a photolithography process, the first sub-pixel electrode PE1 and the first connecting electrode 181 are formed as illustrated in FIG. 7P. The first connecting electrode 181 is connected to the first source electrode SE1 through the first contact hole CH1. In an exemplary embodiment, although not illustrated, in the aforementioned patterning process, the second sub-pixel electrode PE2, the second connecting electrode 181, and the third connecting electrode 183 are also formed. The second connecting electrode 182 is connected to the second source electrode SE2 through the second contact hole CH2. The third connecting electrode 183 is connected to the side surface of the third source electrode SE3, the side surface of the sixth ohmic contact layer 323b, and the storage line 750 through the third contact hole CH3.

FIGS. 8A, 8B, 8C, 8D, and 8E are cross-sectional views illustrating a process of manufacturing an LCD device according to another exemplary embodiment. FIGS. 8A, 8B, 8C, 8D, and 8E illustrate cross-sectional views taken along line I-I' of FIG. 1.

Firstly, as illustrated in FIGS. 7A and 7B, the gate line GL, the first gate electrode GE1, the storage line 750, the first storage electrode 751, the second gate electrode GE2, the third gate electrode GE2, the second storage electrode 752, and the gate insulating layer 311 are formed.

Figure 8A:
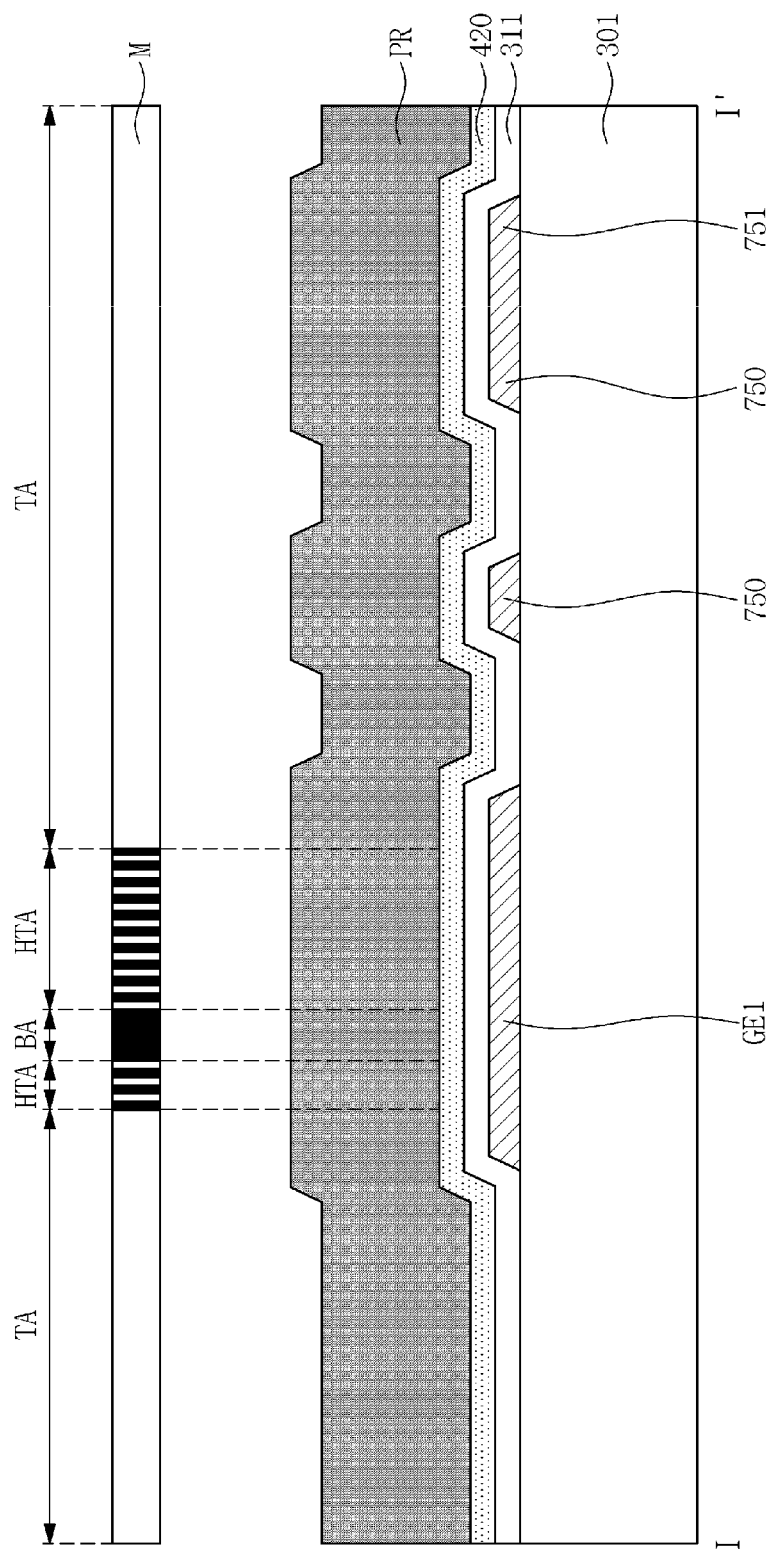
FIGS. 8A, 8B, 8C, 8D, and 8E are cross-sectional views illustrating a process of manufacturing an LCD device according to another exemplary embodiment.

Subsequently, as illustrated in FIG. 8A, the semiconductor material 420 and the photoresist PR are sequentially formed above the gate insulating layer 311. The photoresist PR of FIG. 8A has a greater thickness than a thickness of the photoresist PR of FIG. 7C.

Subsequently, a mask M is disposed above the photoresist PR. The mask M has a transmissive area TA through which light is transmitted, a blocking area BA through which light is blocked, and a half-transmissive area HTA through which light is partially transmitted. The mask M of FIG. 8A is the same as the mask M of FIG. 7C, and thus descriptions pertaining to the mask M of FIG. 8A will make reference to the mask M of FIG. 7C and the related descriptions.

Figure 8B:
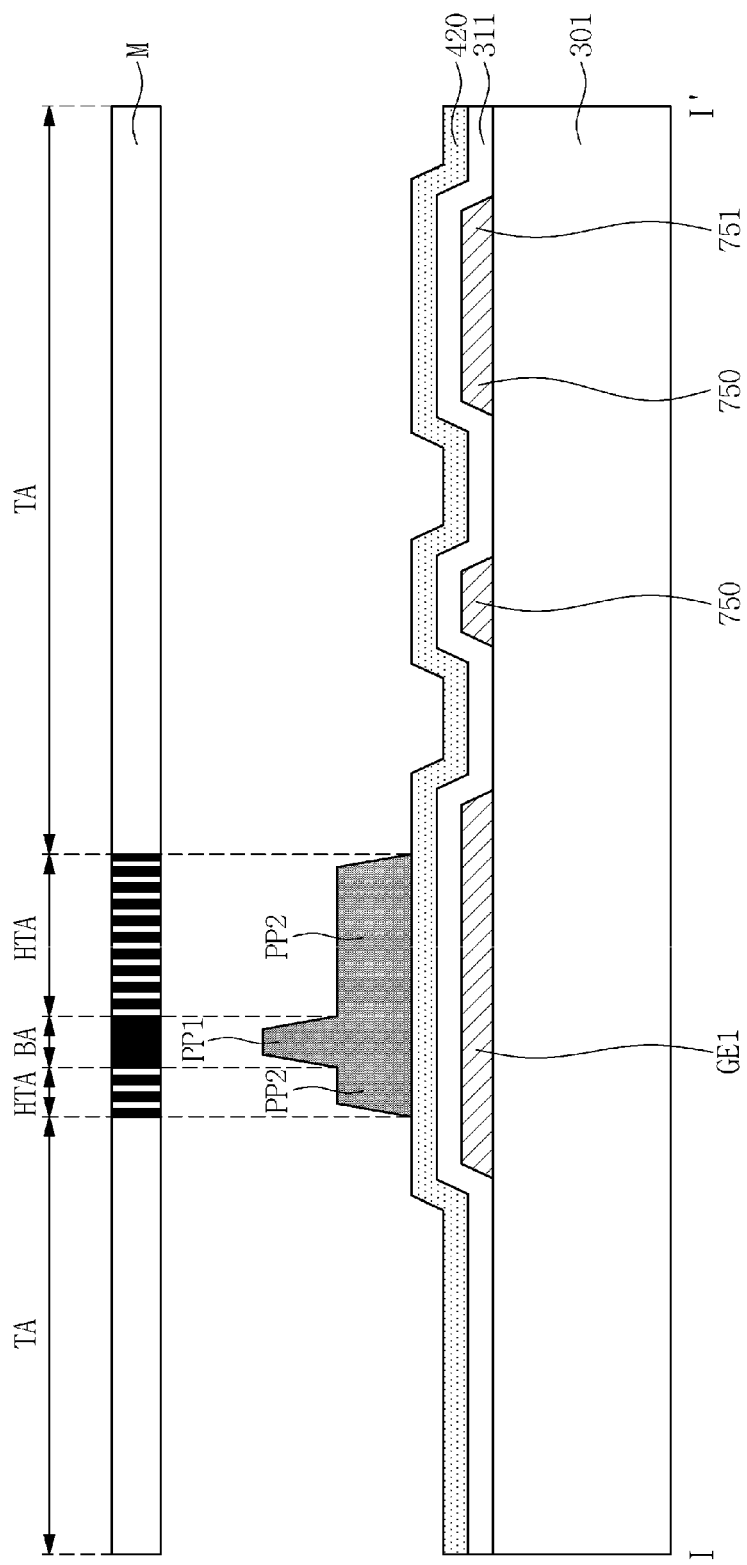

Subsequently, when the photoresist PR is exposed and developed using the mask M of FIG. 8A, the first photoresist pattern PP1 and the second photoresist pattern PP2, which have different thicknesses, are formed above the semiconductor material 420 as illustrated in FIG. 8B. The first photoresist pattern PP1 and the second photoresist pattern PP2 are disposed to correspond to an area of the first semiconductor layer 321 to be formed later. In such an exemplary embodiment, the first photoresist pattern PP1 is disposed to correspond to the channel area of the first switching element TFT1 of the first semiconductor layer 321.

The second photoresist pattern PP2 has a smaller thickness than that of the first photoresist pattern PP1. In such an exemplary embodiment, the first photoresist pattern PP1 of FIG. 8B has a greater thickness than that of the aforementioned first photoresist pattern PP1 of FIG. 7D, and the second photoresist pattern PP2 of FIG. 8B has a greater thickness than that of the aforementioned second photoresist pattern PP2 of FIG. 7D.

Figure 8C:
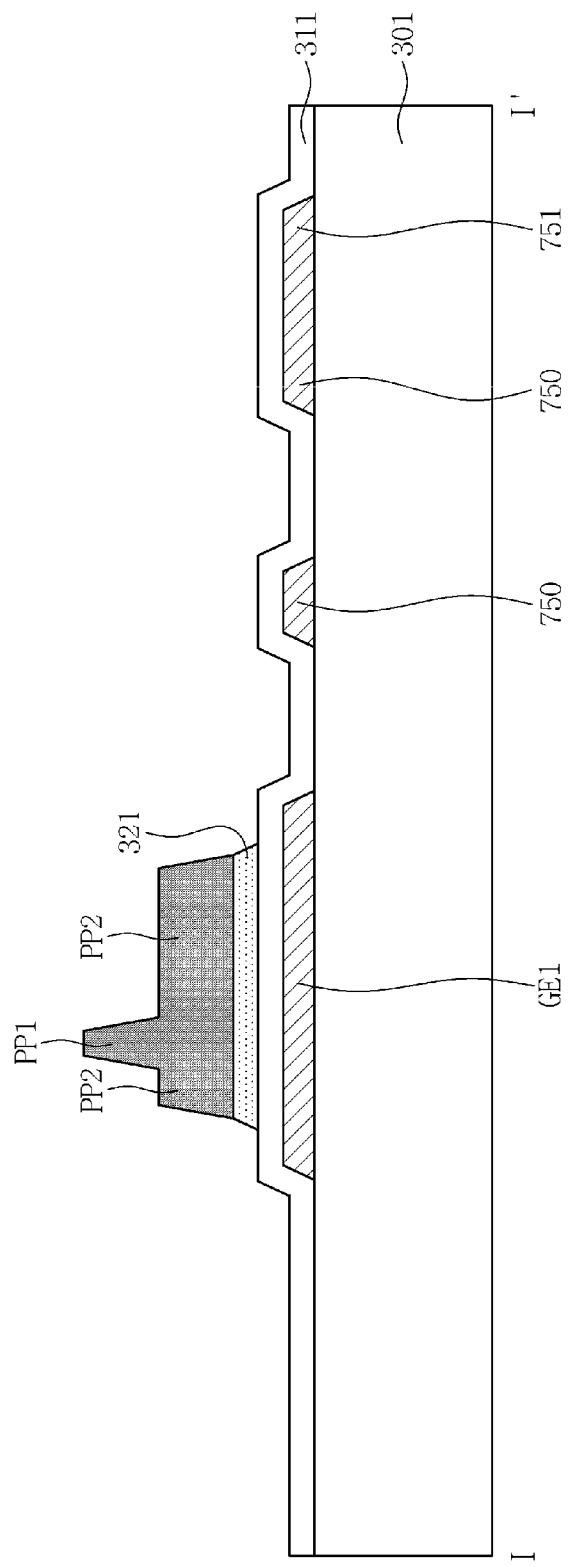

Although not illustrated, through a developing process of the photoresist PR illustrated in FIG. 8C, another first and second photoresist patterns and still another first and second photoresist patterns are formed above the semiconductor material 420. The another first photoresist pattern is disposed to correspond to the channel area of the second switching element TFT2 of the second semiconductor layer 322, and the still another first photoresist pattern is disposed to correspond to the channel area of the third switching element TFT3 of the third semiconductor layer 323.

Subsequently, in the state that the first and second photoresist patterns PP1 and PP2 are used as a mask, the semiconductor material 420 is etched. Then, as illustrated in FIG. 8C, the first semiconductor layer 321 which overlaps the first gate electrode GE1 is formed above the gate insulating layer 311. Although not illustrated, in the aforementioned etching process of the semiconductor material 420, the second semiconductor layer 322 and the third semiconductor layer 323 are also formed above the gate insulating layer 311.

Figure 8D:
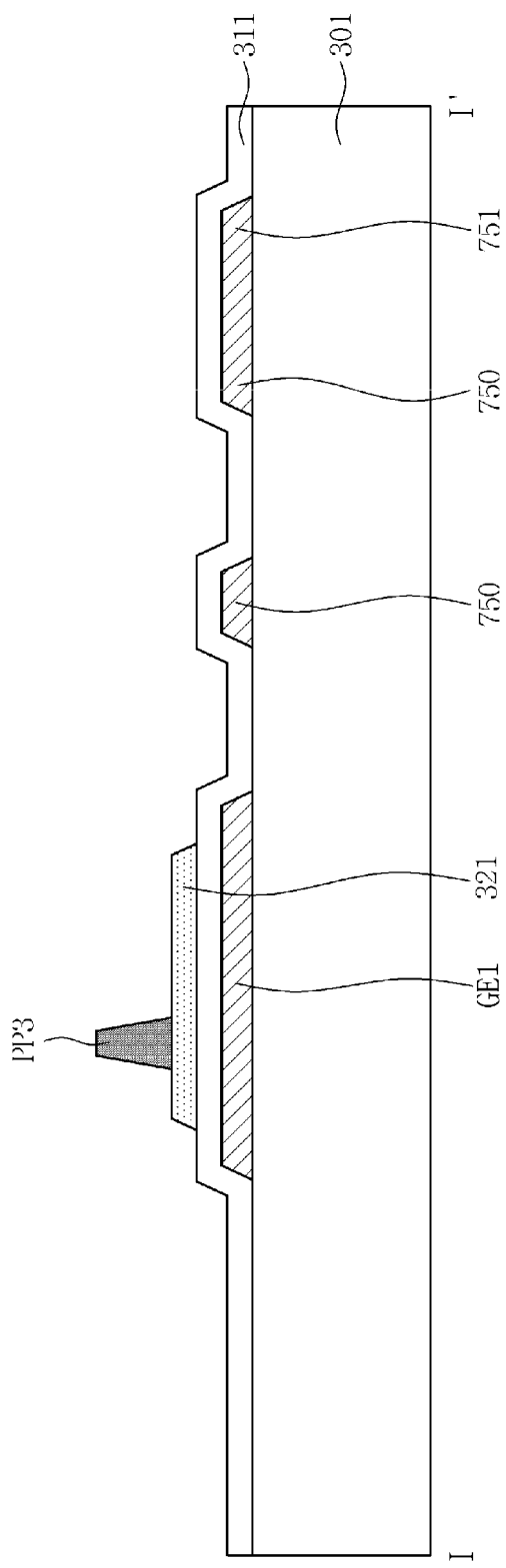

Subsequently, as illustrated in FIG. 8D, an ashing process is performed. In the ashing process, the thickness of the first photoresist pattern PP1 and the thickness of the second photoresist pattern PP2 are reduced by the same level. In such an exemplary embodiment, the ashing process is performed until the second photoresist pattern PP2, having a relatively smaller thickness, is completely removed. That is, the ashing process ends when the second photoresist pattern PP2 is completely removed.

As the second photoresist pattern PP2 is removed, the non-channel area of the first semiconductor layer 321 therebelow is exposed. In an exemplary embodiment, a portion of the first photoresist PP1 is removed through the ashing process, and accordingly, the thickness of the first photoresist pattern PP1 is reduced. Hereinafter, the first photoresist pattern PP1 after ashing is defined as a third photoresist pattern PP3. The third photoresist pattern PP3 is disposed to correspond to the channel area of the first semiconductor layer 321. Although not illustrated, through the ashing process, another third photoresist patterns are disposed to correspond to the channel area of the second semiconductor layer 322 and the channel area of the third semiconductor layer 323.

The third photoresist pattern PP3 of FIG. 8D has a greater thickness than that of the third photoresist pattern PP3 of FIG. 7F.

Figure 8E:
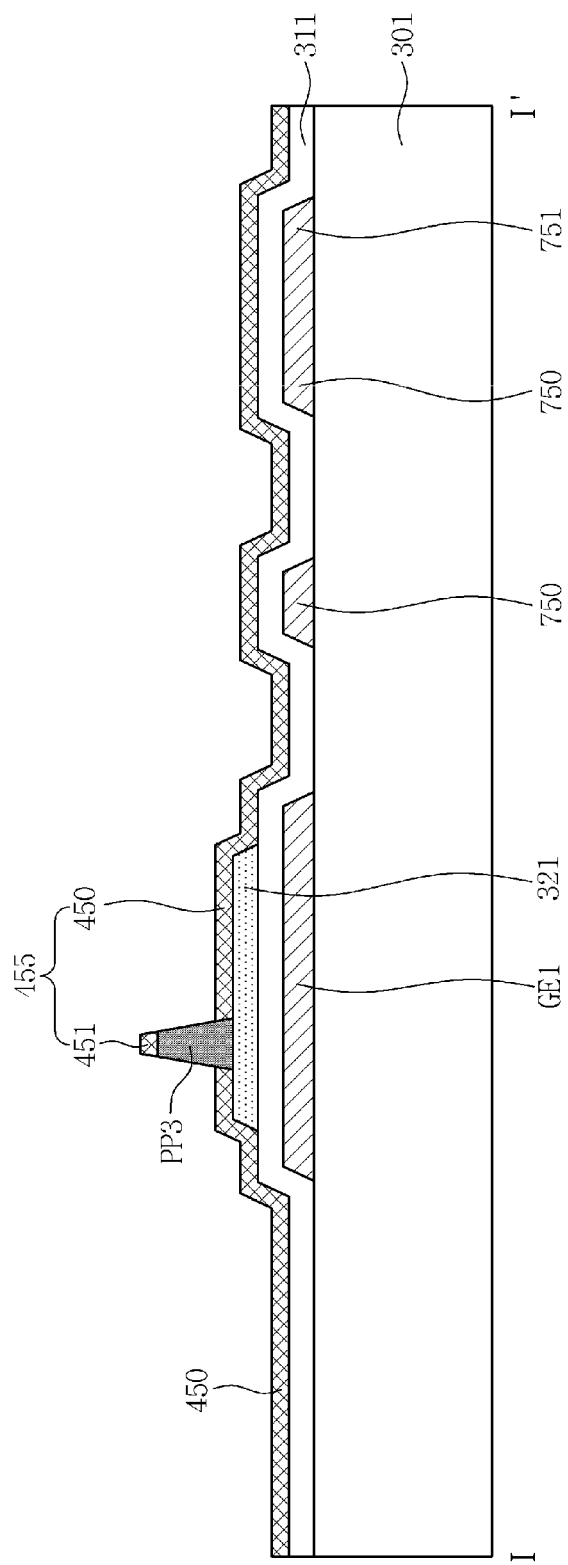

Subsequently, as illustrated in FIG. 8E, an impurity semiconductor material 455 is deposited over the entire surface of the first substrate 301 including the third photoresist pattern PP3. In such an exemplary embodiment, as the third photoresist pattern PP3 is disposed in the channel area of the first semiconductor layer 321, the impurity semiconductor material 455 is not deposited in the channel area of the first semiconductor layer 321. The impurity semiconductor material 455 may include a material included in the aforementioned first ohmic contact layer 321a.

As such, the impurity semiconductor material 455 is not formed in the channel area of the first semiconductor layer 321. Although not illustrated, the third photoresist pattern PP3 is also disposed in the channel area of the second semiconductor layer 322 and the channel area of the third semiconductor layer 323, and accordingly the impurity semiconductor material 455 is not formed in the channel areas of respective ones of the second semiconductor 322 and the third semiconductor layer 323. Accordingly, in the deposition process of the impurity semiconductor material 455, the impurities (e.g., phosphorus (P)) of the impurity semiconductor material 450 may be prevented from diffused into the channel areas of respective ones of the first, second, and third semiconductor layers 321, 322, and 323.

In an exemplary embodiment, as the third photoresist pattern PP3 has a relatively great thickness, an impurity semiconductor material 451 deposited above the third photoresist pattern PP3 is separated from an impurity semiconductor material 450 deposited in another area. Although not illustrated, an impurity semiconductor material deposited above other third photoresist patterns are separated from the impurity semiconductor material 450 deposited in another area.

Subsequently, the third photoresist pattern PP3 is removed through a lift-off process. In the case that the third photoresist pattern PP3 is removed by a strip solution, the impurity semiconductor material 451 deposited above the third photoresist pattern PP3 is also removed. Although not illustrated, the third photoresist pattern in the channel area of the second semiconductor layer 322, the third photoresist pattern in the channel area of the third semiconductor layer 323, and the impurity semiconductor material deposited above each of the third photoresist patterns are also removed by the aforementioned strip solution.

As the third photoresist pattern PP3 is removed, the channel area of the first semiconductor layer 321 therebelow is exposed as illustrated in FIG. 7I. Although not illustrated, as other third photoresist patterns are removed, the channel area of the second semiconductor layer 322 and the channel area of the third semiconductor layer 323 are also exposed.

Subsequently, as illustrated in FIGS. 7J, 7K, 7L, 7M, 7N, 7O, and 7P, the first drain electrode DE1, the first source electrode SE1, the second drain electrode DE2, the second source electrode SE2, the third drain electrode DE3, the third source electrode SE3, the first ohmic contact layer 321a, the second ohmic contact layer 321b, the third ohmic contact layer 322a, the fourth ohmic contact layer 322b, the fifth ohmic contact layer 323a, the sixth ohmic contact layer 323b, the passivation layer 320, the color filter 354, the capping layer 391, the first contact hole CH1, the second contact hole CH2, the third contact hole CH3, the first connecting electrode 181, the second connecting electrode 182, the third connecting electrode 183, the first sub-pixel electrode PE1, and the second sub-pixel electrode PE2 are formed.

FIGS. 9A, 9B, 9C, 9D, 9E, 9F, 9G, and 9H are cross-sectional views illustrating a process of manufacturing an LCD device according to still another exemplary embodiment. FIGS. 9A, 9B, 9C, 9D, 9E, 9F, 9G, and 9H illustrate cross-sectional views taken along line I-I' of FIG. 1.

Firstly, as illustrated in FIGS. 7A and 7B, the gate line GL, the first gate electrode GE1, the storage line 750, the first storage electrode 751, the second gate electrode GE2, the third gate electrode GE2, the second storage electrode 752, and the gate insulating layer 311 are formed.

Figure 9A:
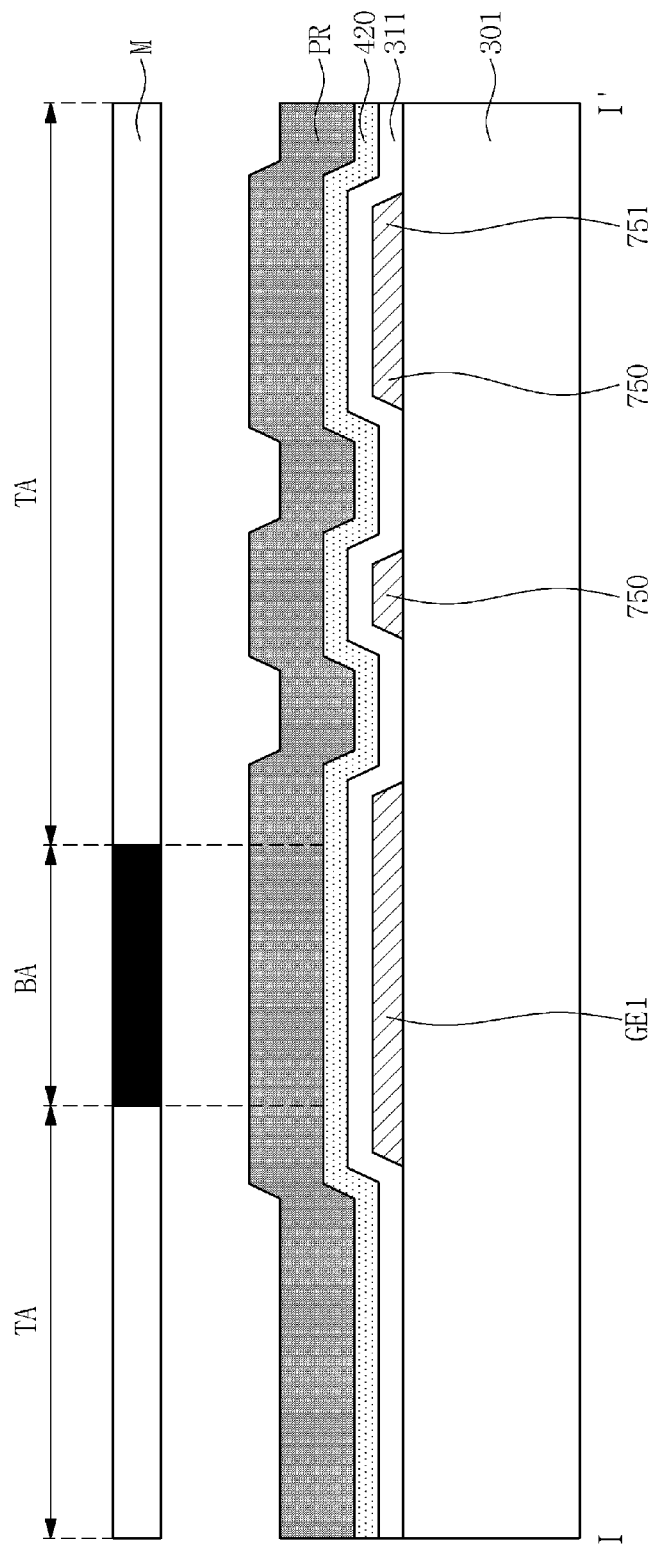
FIGS. 9A, 9B, 9C, 9D, 9E, 9F, 9G, and 9H are cross-sectional views illustrating a process of manufacturing an LCD device according to still another exemplary embodiment.

Subsequently, as illustrated in FIG. 9A, the semiconductor material 420 and the photoresist PR are sequentially formed above the gate insulating layer 311.

Subsequently, a mask M is disposed above the photoresist PR. The mask M has a transmissive area TA through which light is transmitted and a blocking area BA through which light is blocked.

Figure 9B:
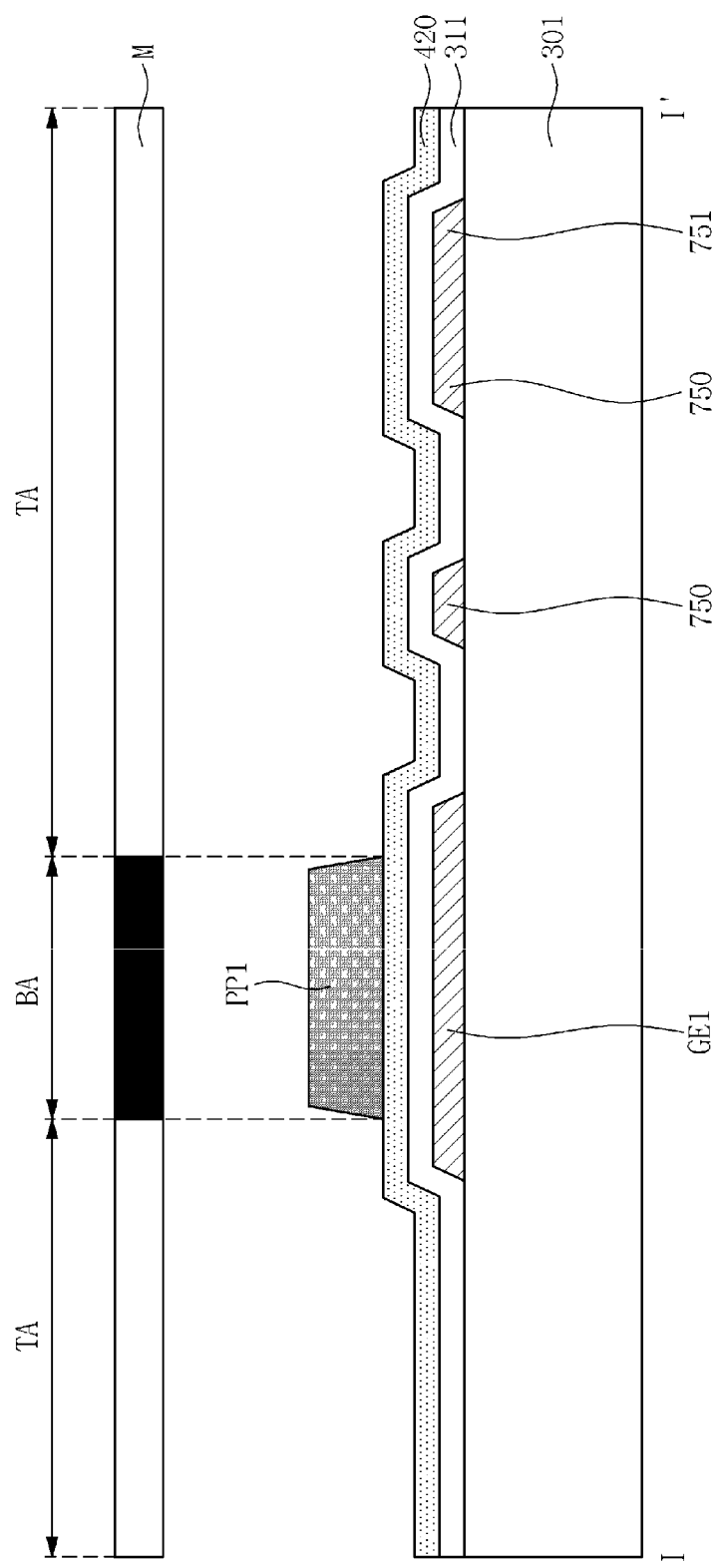

Subsequently, light, e.g., ultraviolet light, is irradiated in a selective manner to the photoresist PR through the mask M such that the photoresist PR is exposed. In the case the photoresist PR that is exposed is developed, the first photoresist pattern PP1 is formed as illustrated in FIG. 9B. The first photoresist pattern PP1 is disposed above a portion of the semiconductor material 420 corresponding to the blocking area BA of the mask M. In other words, the first photoresist pattern PP1 is disposed to correspond to an area of the first semiconductor layer 321 to be formed later. In an exemplary embodiment, the photoresist PR corresponding to the transmissive area TA of the mask M is removed.

In an exemplary embodiment, although not illustrated, through the aforementioned developing process of the photoresist PR, another first photoresist pattern and still another first photoresist pattern are formed above the semiconductor material 420. The another first photoresist pattern is disposed to correspond to an area to be formed with the second semiconductor layer 322, and the still another first photoresist pattern is disposed to correspond to an area to be formed with the third semiconductor layer 323.

Figure 9C:
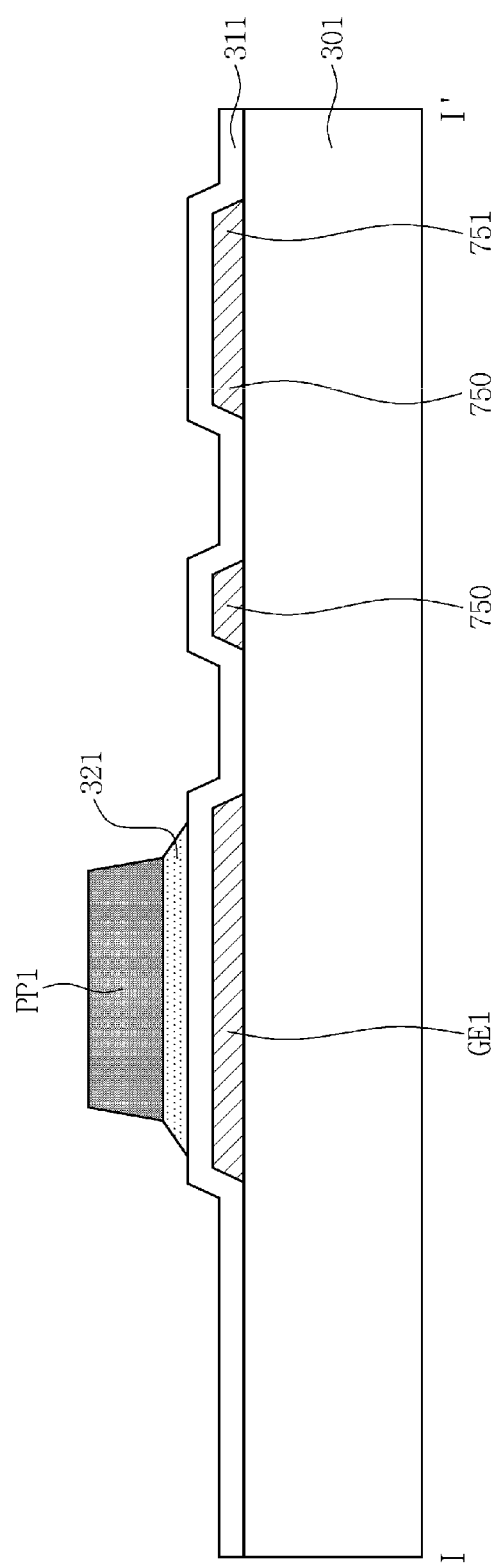

Subsequently, in the state that the first photoresist pattern PP1 is exist, the semiconductor material 420 is etched using the first photoresist pattern PP1 as a mask. Then, as illustrated in FIG. 9C, the first semiconductor layer 321 which overlaps the first gate electrode GE1 is formed above the gate insulating layer 311.

The semiconductor material 420 may be removed in a directional etching method. In the case of the directional etching, an etching speed in the vertical direction is relatively high, whereas an etching speed in the horizontal direction is relatively low. In such an exemplary embodiment, as an etching depth increases, the etching speed in the horizontal direction gradually decreases due to crystal orientation of the semiconductor material 450. Accordingly, as illustrated in FIG. 9C, opposite side surfaces (inclined opposite side surfaces) of the first semiconductor layer 321 are not covered by the first photoresist pattern PP.

Although not illustrated, in the aforementioned etching process of the semiconductor material 420, the second semiconductor layer 322 and the third semiconductor layer 323 are also formed above the gate insulating layer 311. In such an exemplary embodiment, opposite side surfaces (inclined opposite side surfaces) of the second semiconductor layer 322 are not covered by the first photoresist pattern PP as well, and opposite side surfaces (inclined opposite side surfaces) of the third semiconductor layer 323 are not covered by the first photoresist pattern PP as well.

Figure 9D:
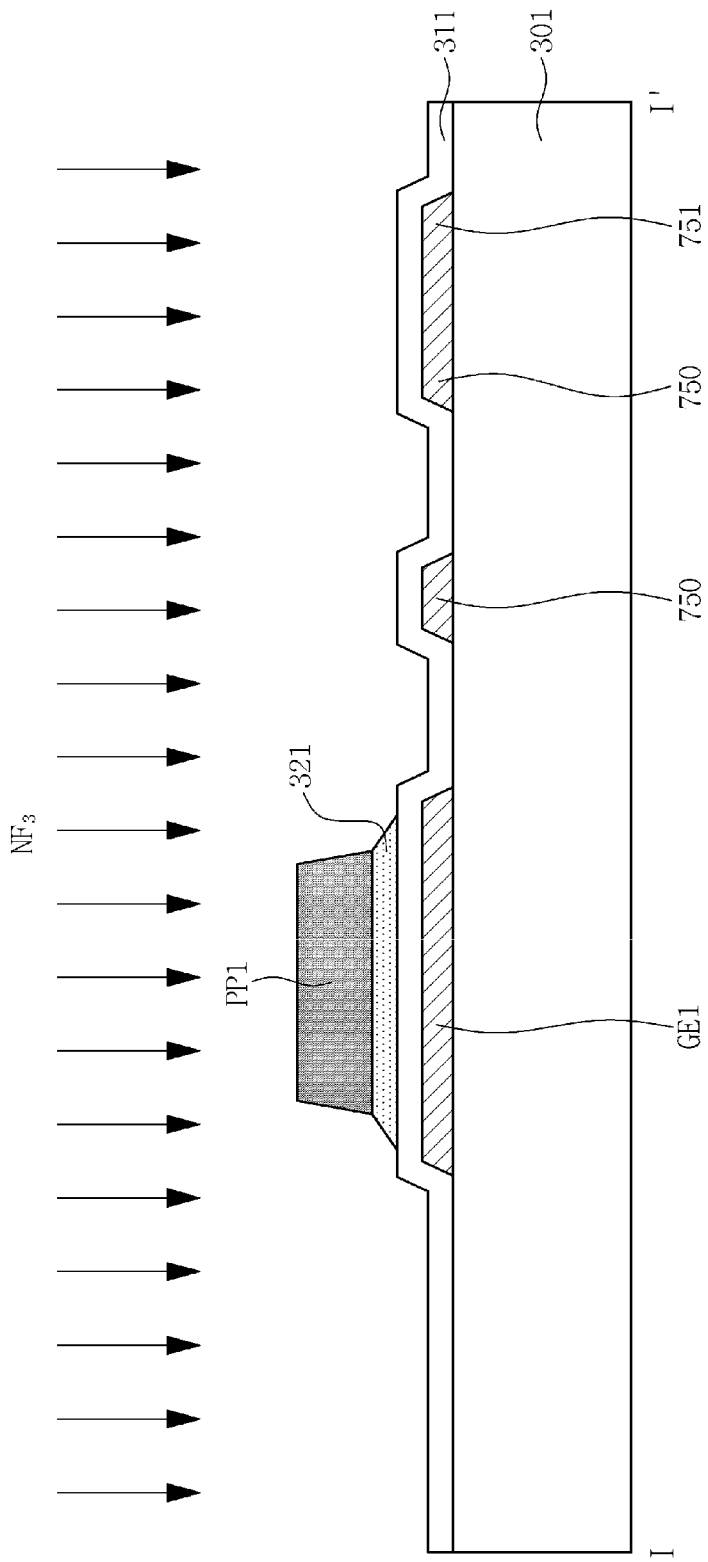

Subsequently, as illustrated in FIG. 9D, a hydrophobization process is performed on the first photoresist pattern PP1. Descriptions pertaining to the hydrophobization process will make reference to FIG. 7G and related descriptions.

Figure 9E:
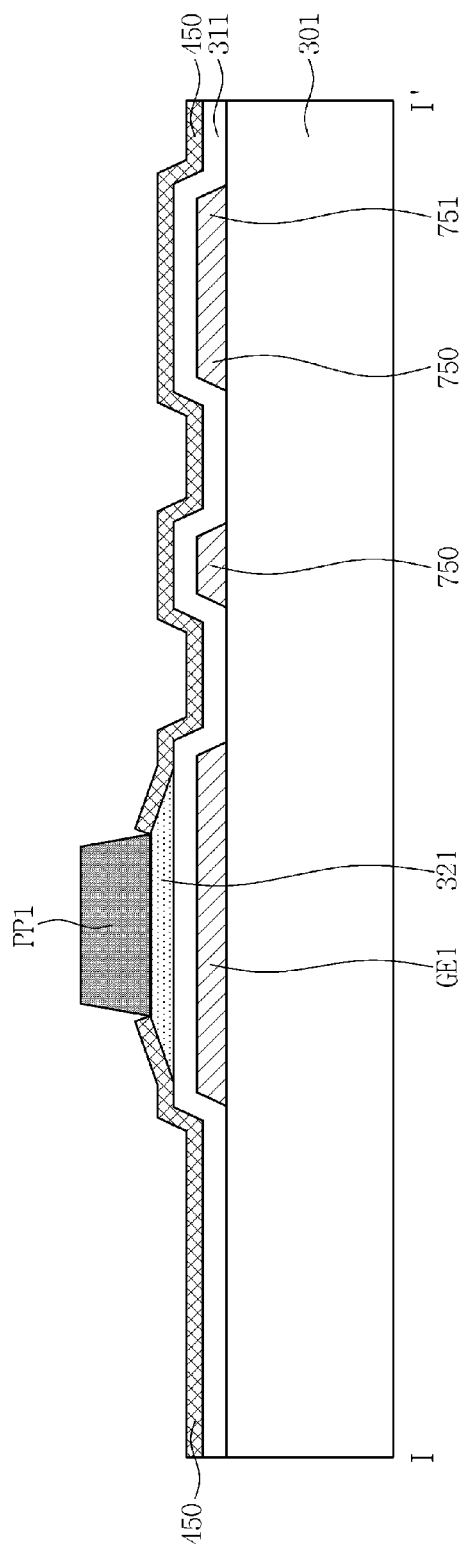

Subsequently, as illustrated in FIG. 9E, the impurity semiconductor material 450 is deposited over the entire surface of the first substrate 301 excluding the first photoresist pattern PP1 that is hydrophobizated. The impurity semiconductor material 450 may include or be formed of a material included in the first ohmic contact layer 321a. In such an exemplary embodiment, the impurity semiconductor material 450, as illustrated in FIG. 9E, is not deposited above the first photoresist pattern PP1, which is because a surface of the first photoresist pattern PP1 has hydrophobic characteristics. Accordingly, the impurity semiconductor material 450 is deposited in a selective manner above the first substrate 301, e.g., above the gate insulating layer 311 and the non-channel area of the first semiconductor layer 321, except a portion of the first substrate 301 corresponding to the first photoresist pattern PP1.

The impurity semiconductor material 450 may not be formed in the channel area of the first semiconductor layer 321 due to the first photoresist pattern PP1 that is hydrophobizated. Although not illustrated, the first photoresist pattern PP1 that is hydrophobizated is also disposed in the channel area of the second semiconductor layer 322 and the channel area of the third semiconductor layer 323, and thus the impurity semiconductor material 450 is not formed in the channel area of the second semiconductor layer 322 and the channel area of the third semiconductor layer 323 as well. As a result, the impurity semiconductor material 450 may be disposed only on an inclined surface of the semiconductor layer and may not be disposed on the flat surface of the semiconductor layer. Accordingly, in the deposition process of the impurity semiconductor material 450, impurities (e.g., phosphorus (P)) of the impurity semiconductor material 450 may be prevented from diffusing into the channel areas of respective ones of the first, second, and third semiconductor layers 321, 322, and 323.

Figure 9F:
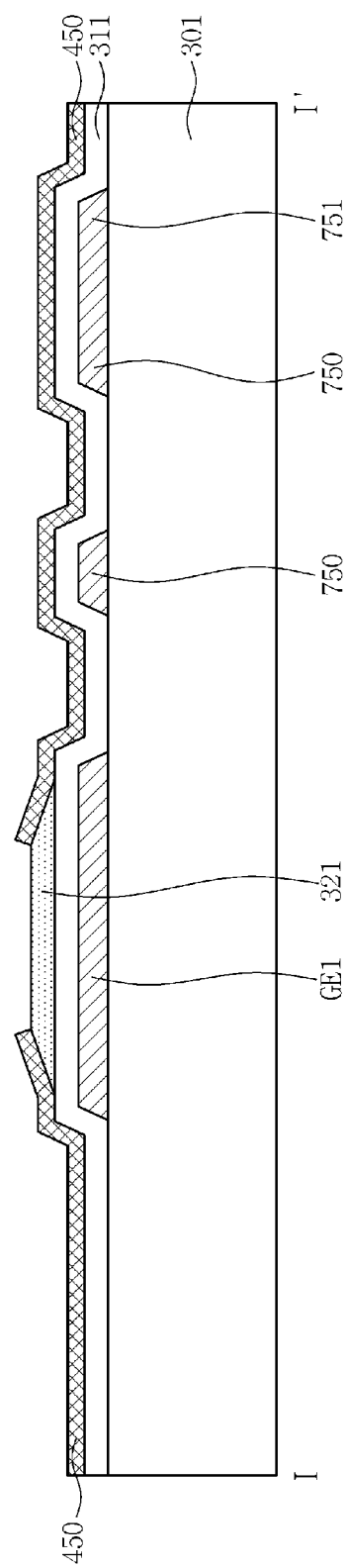

Subsequently, as illustrated in FIG. 9F, the first photoresist pattern PP1 is removed. Descriptions pertaining to the process related to FIG. 9F will make reference to FIG. 7I and the related descriptions. As the first photoresist pattern PP1 is removed, the channel area of the first semiconductor layer 321 therebelow is exposed. Although not illustrated, in a process of removing the first photoresist pattern, the first photoresist pattern in the channel area of the second semiconductor layer 322 and the first photoresist pattern in the channel area of the third semiconductor layer 323 are also removed.

Figure 9G:
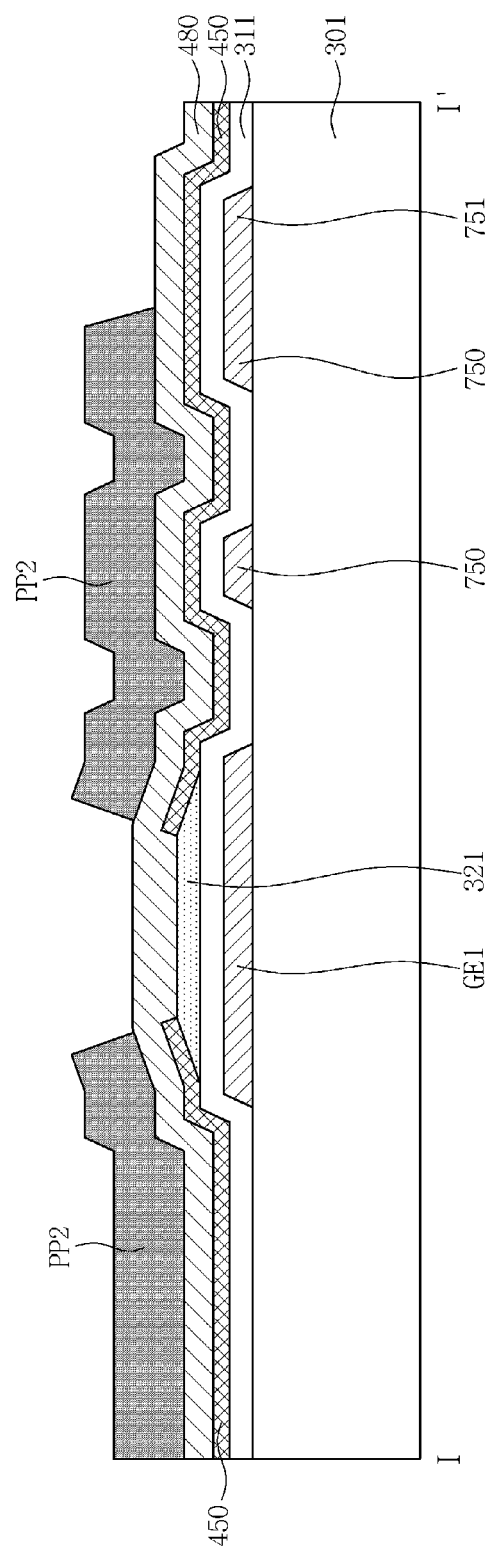

Subsequently, as illustrated in FIG. 9G, the source metal layer 480 is formed above the impurity semiconductor material 450, the first semiconductor layer 321, the second semiconductor layer 322, and the third semiconductor layer 323. Subsequently, the second photoresist pattern PP2 is formed above the source metal layer 480. Descriptions pertaining to FIG. 9G will make reference to FIG. 7J and the related descriptions.

In the state that the second photoresist pattern PP2 of FIG. 9G is used as a mask, the source metal layer 480 and the impurity semiconductor material 450 are patterned through an etching process. In such an exemplary embodiment, both of the source metal layer 480 and the impurity semiconductor material 450 are removed by a wet etching method, which is attributed to the impurity semiconductor material 450 including the impurities at high concentration. For example, the impurity semiconductor material 450 may include impurities at a concentration of about $2*10^{21}$ atom/$cm^3$ or higher, and the impurity semiconductor material 450 including the impurities at such a high concentration may have characteristics substantially similar to metal and thus may be removed through the wet etching method.

Figure 9H:
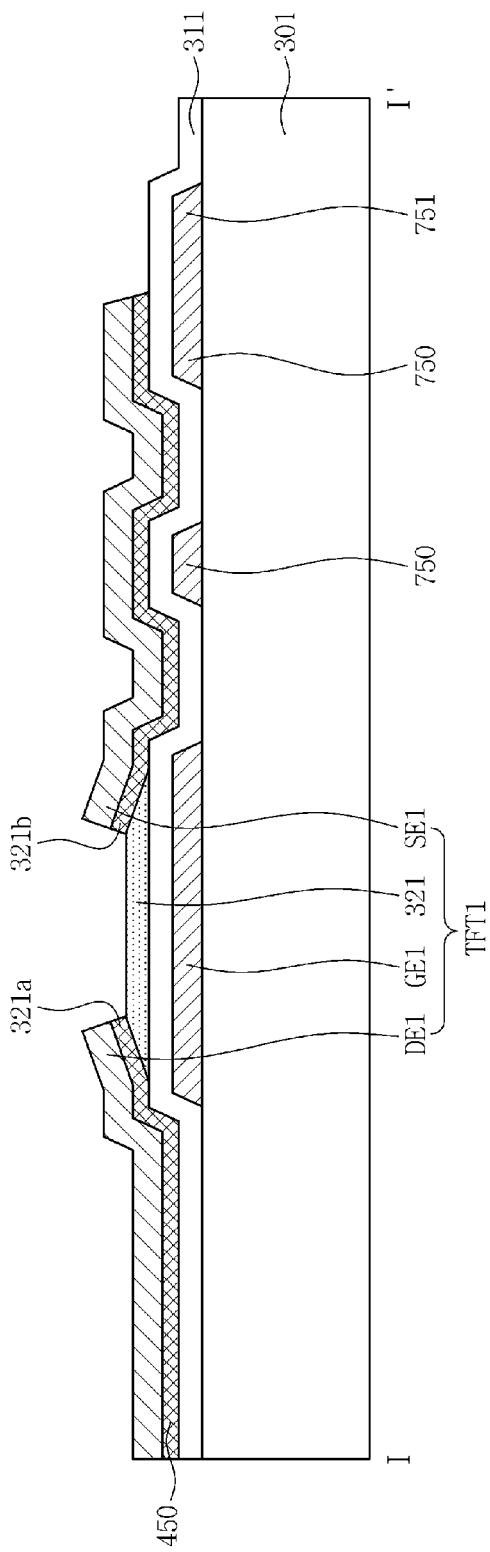

Through the aforementioned patterning process, the first ohmic contact layer 321a, the second ohmic contact layer 321b, the first drain electrode DE1, and the first source electrode SE1 are formed as illustrated in FIG. 9H. Although not illustrated, the third ohmic contact layer 322a, the fourth ohmic contact layer 322b, the fifth ohmic contact layer 323a, the sixth ohmic contact layer 323b, the second drain electrode DE2, the second source electrode SE2, the third drain electrode DE3, and the third source electrode SE3 are also formed through the patterning process.

Subsequently, as illustrated in FIGS. 7I, 7J, 7K, 7L, 7M, 7N, 7O, and 7P, the passivation layer 320, the color filter 354, the capping layer 391, the first contact hole CH1, the second contact hole CH2, the third contact hole CH3, the first connecting electrode 181, the second connecting electrode 182, the third connecting electrode 183, the first sub-pixel electrode PE1, and the second sub-pixel electrode PE2 are formed.

As set forth above, according to one or more exemplary embodiments, the LCD device and the method of manufacturing the LCD device have the following effects.

First, in the deposition process of the impurity semiconductor material, impurities of the impurity semiconductor material may be significantly reduced or prevented from diffusing into the channel area of the semiconductor layer.

Second, the impurity semiconductor material used in manufacturing of the ohmic contact layer includes impurities at high concentration. Accordingly, the impurity semiconductor material may have characteristics substantially similar to metal and thus may be removed by a wet etching method. Therefore, in a wet etching process for forming the source electrode, the drain electrode, and the ohmic contact layer, the channel area of the semiconductor layer may not be damaged.

From the foregoing, it will be appreciated that various embodiments in accordance with the present disclosure have been described herein for purposes of illustration, and that various modifications may be made without departing from the scope and spirit of the present teachings. Accordingly, the various embodiments disclosed herein are not intended to be limiting of the true scope and spirit of the present teachings.

What is claimed is:

1. A method of manufacturing a liquid crystal display device, the method comprising:
   forming a gate electrode above a substrate;
   forming a gate insulating layer above the gate electrode;
   forming a semiconductor material above the gate insulating layer;
   forming a first photoresist pattern and a second photoresist pattern above the semiconductor material, the second photoresist pattern having a smaller thickness than a thickness of the first photoresist pattern;
   patterning, using the first photoresist pattern and the second photoresist pattern as a mask, the semiconductor material to form a semiconductor layer which overlaps the gate electrode;
   removing a portion of the first photoresist pattern and the second photoresist pattern to form a third photoresist pattern which is disposed to correspond to a channel area of the semiconductor layer;

hydrophobizating the third photoresist pattern;

forming an impurity semiconductor material above the gate insulating layer and the semiconductor layer using the third photoresist pattern that is hydrophobizated as a mask;

removing the third photoresist pattern;

forming a conductive material above the impurity semiconductor material and the semiconductor layer;

patterning, using a fourth photoresist pattern as a mask, the impurity semiconductor material and the conductive material to form a first ohmic contact layer, a second ohmic contact layer, a drain electrode, and a source electrode; and forming a pixel electrode which is connected to one of the drain electrode and the source electrode.

2. The method as claimed in claim 1, wherein the hydrophobizating of the third photoresist pattern comprises exposing the third photoresist pattern to $NF_3$.

3. The method as claimed in claim 1, wherein each of the first ohmic contact layer and the second ohmic contact layer has an impurity concentration of about $2*10^{21}$ atom/cm$^3$ or higher.

4. The method as claimed in claim 3, wherein the forming of the first ohmic contact layer, the second ohmic contact layer, the drain electrode, and the source electrode comprises:

forming the fourth photoresist pattern above the conductive material; and patterning, using the fourth photoresist pattern as a mask, the conductive material and the impurity semiconductor material in a wet etching method to form the first ohmic contact layer, the second ohmic contact layer, the drain electrode, and the source electrode.

5. A method of manufacturing a liquid crystal display device, the method comprising:

forming a gate electrode above a substrate;

forming a gate insulating layer above the gate electrode;

forming a semiconductor material above the gate insulating layer;

forming a first photoresist pattern and a second photoresist pattern above the semiconductor material, the second photoresist pattern having a smaller thickness than a thickness of the first photoresist pattern;

patterning, using the first photoresist pattern and the second photoresist pattern as a mask, the semiconductor material to form a semiconductor layer which overlaps the gate electrode;

removing a portion of the first photoresist pattern and the second photoresist pattern to form a third photoresist pattern which is disposed to correspond to a channel area of the semiconductor layer;

forming an impurity semiconductor material above the gate insulating layer, the semiconductor layer, and the third photoresist pattern;

removing the third photoresist pattern and the impurity semiconductor material above the third photoresist pattern in a lift-off method;

forming a conductive material above the impurity semiconductor material and the semiconductor layer;

patterning, using a fourth photoresist pattern as a mask, the impurity semiconductor material and the conductive material to form a first ohmic contact layer, a second ohmic contact layer, a drain electrode, and a source electrode; and forming a pixel electrode which is connected to one of the drain electrode and the source electrode.

6. The method as claimed in claim 5, wherein each of the first ohmic contact layer and the second ohmic contact layer has an impurity concentration of about $2*10^{21}$ atom/cm$^3$ or higher.

7. The method as claimed in claim 6, wherein the forming of the first ohmic contact layer, the second ohmic contact layer, the drain electrode, and the source electrode comprises:

forming the fourth photoresist pattern above the conductive material; and patterning, using the fourth photoresist pattern as a mask, the conductive material and the impurity semiconductor material in a wet etching method to form the first ohmic contact layer, the second ohmic contact layer, the drain electrode, and the source electrode.

8. A method of manufacturing a liquid crystal display device, the method comprising:

forming a gate electrode above a substrate;

forming a gate insulating layer above the gate electrode;

forming a semiconductor material above the gate insulating layer;

forming a first photoresist pattern above the semiconductor material;

patterning, using the first photoresist pattern as a mask, the semiconductor material to form a semiconductor layer which overlaps the gate electrode;

hydrophobizating the first photoresist pattern;

forming an impurity semiconductor material above an inclined surface of the semiconductor layer and the gate insulating layer using the first photoresist pattern that is hydrophobizated as a mask;

removing the first photoresist pattern;

forming a conductive material above the impurity semiconductor material and the semiconductor layer;

patterning, using a second photoresist pattern as a mask, the impurity semiconductor material and the conductive material to form a first ohmic contact layer, a second ohmic contact layer, a drain electrode, and a source electrode; and forming a pixel electrode which is connected to one of the drain electrode and the source electrode.

9. The method as claimed in claim 8, wherein the hydrophobizating of the first photoresist pattern comprises exposing the first photoresist pattern to $NF_3$.

10. The method as claimed in claim 8, wherein each of the first ohmic contact layer and the second ohmic contact layer has an impurity concentration of about $2*10^{21}$ atom/cm$^3$ or higher.

11. The method as claimed in claim 10, wherein the forming of the first ohmic contact layer, the second ohmic contact layer, the drain electrode, and the source electrode comprises:

forming a third photoresist pattern above the conductive material; and patterning, using the third photoresist pattern as a mask, the conductive material and the impurity semiconductor material in a wet etching method to form the first ohmic contact layer, the second ohmic contact layer, the drain electrode, and the source electrode.

\* \* \* \* \*